United States Patent
Mori et al.

(10) Patent No.: US 10,011,921 B2
(45) Date of Patent: Jul. 3, 2018

(54) METHOD FOR PRODUCING GROUP III ELEMENT NITRIDE CRYSTAL, GROUP III ELEMENT NITRIDE CRYSTAL, SEMICONDUCTOR DEVICE, METHOD FOR PRODUCING SEMICONDUCTOR DEVICE, AND GROUP III ELEMENT NITRIDE CRYSTAL PRODUCTION DEVICE

(71) Applicants: OSAKA UNIVERSITY, Suita-shi, Osaka (JP); ITOCHU PLASTICS INC., Tokyo (JP); National University Corporation Tokyo University of Agriculture and Technology, Fuchu-shi, Tokyo (JP)

(72) Inventors: Yusuke Mori, Osaka (JP); Masashi Yoshimura, Osaka (JP); Mamoru Imade, Osaka (JP); Masashi Isemura, Tokyo (JP); Akinori Koukitu, Tokyo (JP)

(73) Assignees: Osaka University, Osaka (JP); Itochu Plastics Inc., Tokyo (JP); National University Corporation Tokyo University of Agriculture and Technology, Tokyo (JP)

( * ) Notice: Subject to any disclaimer, the term of this patent is extended or adjusted under 35 U.S.C. 154(b) by 0 days.

(21) Appl. No.: 15/523,163

(22) PCT Filed: Oct. 28, 2015

(86) PCT No.: PCT/JP2015/080363
§ 371 (c)(1),
(2) Date: Apr. 28, 2017

(87) PCT Pub. No.: WO2016/068181
PCT Pub. Date: May 6, 2016

(65) Prior Publication Data
US 2017/0321348 A1  Nov. 9, 2017

(30) Foreign Application Priority Data

Oct. 29, 2014  (JP) .................................. 2014-220681

(51) Int. Cl.
*C30B 29/40* (2006.01)
*H01L 21/00* (2006.01)
(Continued)

(52) U.S. Cl.
CPC .............. *C30B 29/406* (2013.01); *C30B 9/02* (2013.01); *C30B 25/02* (2013.01);
(Continued)

(58) Field of Classification Search
CPC ............ H01L 21/0254; H01L 21/0262; H01L 21/205; H01L 29/2003; C30B 29/406;
(Continued)

(56) References Cited

U.S. PATENT DOCUMENTS

2004/0183090 A1  9/2004  Kitaoka et al.
2014/0328742 A1  11/2014  Mori et al.
2016/0268129 A1  9/2016  Mori et al.

FOREIGN PATENT DOCUMENTS

EP  3 056 592  8/2016
JP  52-23600  2/1977
(Continued)

OTHER PUBLICATIONS

Bu et al., "Growth of GaN films with low oxygen concentration using Ga$_2$O vapor and NH$_3$", Journal of Crystal Growth, 2011, vol. 327, pp. 89-93.
(Continued)

*Primary Examiner* — Nikolay Yushin
(74) *Attorney, Agent, or Firm* — Hamre, Schumann, Mueller & Larson, P.C.

(57) ABSTRACT

To provide a method for producing a Group III element nitride crystal by growing it on a plane on the –c-plane side
(Continued)

as a crystal growth plane. The present invention is a method for producing a Group III element nitride crystal, including a vapor phase growth step of growing a Group III element nitride crystal 12 on a crystal growth plane of a Group III element nitride seed crystal 11 by vapor deposition. The vapor phase growth step is a step of causing a Group III metal, an oxidant, and a nitrogen-containing gas to react with one another to grow the Group III element nitride crystal 12 or includes: a reduced product gas generation step of causing a Group III element oxide and a reducing gas to react with each other to generate a gas of a reduced product of the Group III element oxide; and a crystal generation step of causing the gas of the reduced product and a nitrogen-containing gas to react with each other to generate the Group III element nitride crystal 12. The crystal growth plane is a plane on the −c-plane side. A crystal growth temperature is 1200° C. or more. In the vapor phase growth step, the Group III element nitride crystal is grown in an approximately −c direction.

43 Claims, 20 Drawing Sheets

(51) Int. Cl.
*C30B 9/02* (2006.01)
*H01L 29/20* (2006.01)
*C30B 25/02* (2006.01)
*H01L 21/02* (2006.01)

(52) U.S. Cl.
CPC ...... *H01L 21/0254* (2013.01); *H01L 21/0262* (2013.01); *H01L 29/2003* (2013.01)

(58) Field of Classification Search
CPC ........... C30B 29/403; C30B 9/02; C30B 9/00; C30B 25/02; C30B 25/14
See application file for complete search history.

(56) References Cited

FOREIGN PATENT DOCUMENTS

| | | |
|---|---|---|
| JP | 2002-293696 | 10/2002 |
| JP | 2009-234800 | 10/2009 |
| JP | 4588340 B | 12/2010 |
| WO | 02/069376 | 9/2002 |
| WO | 2013/105618 | 7/2013 |
| WO | 2015/053341 | 4/2015 |

OTHER PUBLICATIONS

Bu et al., "Effect of $H_2$ carrier gas on the physical properties of a GaN layer grown using $Ga_2O$ vapor and $NH_3$", Journal of Crystal Growth, 2014, vol. 392, pp. 1-4.

Imade et al., "Vapor-phase epitaxy of high-crystallinity GaN films using $Ga_2O$ vapor and $NH_3$", Journal of Crystal Growth, 2010, vol. 312, pp. 676-679.

Extended European Search Report issued in the corresponding European Patent Application No. 15855510.2, dated Apr. 10, 2018, 9 pages.

(a)

(b)

(c)

(d)

(e)

(a)

(b)

(c)

(d)

(e)

| Growing temperature | 1100°C (Reference Example (1)) | 1150°C (Reference Example (2)) | 1200°C (Example 4) |
|---|---|---|---|
| Partial pressure of Ga₂O | 17.3 Pa | 18.1 Pa | 19.4 Pa |
| Bird's eye SEM image | | | |
| Cross-sectional SEM image | | | |
| Growth rate | 15 μm/h | 13 μm/h | 11 μm/h |

METHOD FOR PRODUCING GROUP III ELEMENT NITRIDE CRYSTAL, GROUP III ELEMENT NITRIDE CRYSTAL, SEMICONDUCTOR DEVICE, METHOD FOR PRODUCING SEMICONDUCTOR DEVICE, AND GROUP III ELEMENT NITRIDE CRYSTAL PRODUCTION DEVICE

TECHNICAL FIELD

The present invention relates to a method for producing a Group III element nitride crystal, a Group III element nitride crystal, a semiconductor device, a method for producing a semiconductor device, and a Group III element nitride crystal production device.

BACKGROUND ART

A Group III nitride semiconductor (also called a Group III nitride compound semiconductor or a GaN semiconductor) such as gallium nitride (GaN) has been used widely as a material for various semiconductor devices such as a laser diode (LD) and a light-emitting diode (LED). For example, the laser diode (LD) that emits blue light is applied to a high-density optical disc or a display, and a light-emitting diode (LED) that emits blue light is applied to a display or illumination. Moreover, an ultraviolet LD is expected to be applied to biotechnology and the like, and an ultraviolet LED is expected as an ultraviolet source of a fluorescent lamp.

Examples of a commonly-used method for producing a Group III nitride (e.g., GaN) crystal substrate include vapor deposition (vapor-phase epitaxial growth, i.e., Hydride Vapor Phase Epitaxy) and liquid deposition. Each deposition method has specific characteristics. The vapor deposition can be performed easily and thus is suitable for mass production. Examples of the vapor deposition include halide vapor phase epitaxy (Patent Document 1) and metalorganic chemical vapor deposition (MOCVD).

PRIOR ART DOCUMENTS

Patent Documents

Patent Document 1: JP S52-23600 A
Patent Document 2: JP 2002-293696 A

SUMMARY OF INVENTION

Problem to be Solved by the Invention

In recent years, there has been an increasing demand for an increased size of the Group III element nitride crystal with an increase in diameters of semiconductor devices.

The Group III element nitride crystal is generally a hexagonal crystal. Crystal planes of the hexagonal crystal include an a-plane, an m-plane, and a c-plane. Among them, the c-plane is suitable as a crystal growth plane. The c-plane is thus used as a crystal growth plane in the method for producing an industrially applicable Group III element nitride crystal.

However, the commonly-used method for producing a Group III element nitride crystal using a c-plane as a crystal growth plane involves the following problems in terms of increasing the size of the Group III element nitride crystal. The problems are described below with reference to drawings.

Steps of the commonly-used method for producing a Group III element nitride crystal are schematically shown in step cross-sectional views of (a) to (e) in FIG. 22A. In FIG. 22B, (a) to (e) are perspective views of the respective steps in (a) to (e) in FIG. 22A.

As shown in (a) in FIG. 22A, a Group III element nitride seed crystal (hereinafter also merely referred to as a "seed crystal") 11 is disposed on a substrate 10. In (a) in FIG. 22B that is a perspective view of (a) in FIG. 22A, the substrate 10 is omitted for visibility. The same applies to (b) to (e) in FIG. 22B.

As shown in (b) in each of FIGS. 22A and 22B, a Group III element nitride crystal (hereinafter also merely referred to as a "crystal) 12 is then grown from the seed crystal 11. As shown in (c) to (d) in FIG. 22A ((c) to (d) in FIG. 22B), the crystal 12 is then further grown to be big. As shown in (d) in each of FIGS. 22A and 22B, the crystal 12 is thereafter sliced laterally along dotted lines 13 and 14. A plate-like Group III element nitride crystal substrate 12a as shown in (e) in eacn of FIGS. 22A and 22B thus can be obtained.

However, in the crystal growth shown in FIGS. 22A and 22B, the diameter of the grown (deposited) crystal is reduced toward the top (newly deposited part) as shown in FIGS. 22A and 22B. This crystal growth thus has a limitation in increasing the size of the crystal. Although the crystal 12 is grown in the lateral direction (direction parallel with the plane of the substrate 10) as shown in FIGS. 22A and 22B, it is difficult to obtain a crystal having a size in the lateral direction that is larger than the substrate 10. Moreover, as the crystal 12 is grown (deposited) further and further, the crystal 12 thus have a higher quality without crystal defects and the like taken over from the substrate 10. However, as mentions above, the diameter of the grown (deposited) crystal is reduced toward the top (newly deposited part). It is thus difficult to obtain a high-quality, large crystal.

In order to solve this problem, a plane on the –c-plane side that is a plane on the opposite side of the c-plane is considered to be used as a crystal growth plane. Hereinafter, the c-plane that is a crystal growth plane in the commonly-used crystal growth steps as shown in (a) to (e) in each of FIGS. 22A and 22B is referred to as a +c-plane to differentiate from the –c-plane.

Step cross-sectional views (a) to (e) in FIG. 1A and perspective views (a) to (e) in FIG. 1B schematically illustrate steps in the method for producing a Group III element nitride crystal using the –c-plane as a crystal growth plane. As shown in FIGS. 1A and 1B, this method for producing a Group III element nitride crystal is the same as the method shown in (a) to (e) in each of FIGS. 22A and 22B except that the –c-plane is used as a crystal growth plane as a substitute for the +c-plane. In the method shown in (a) to (e) in each of FIGS. 1A and 1B, the diameter of the grown (deposited) crystal is increasing toward the top (newly deposited part) as shown in FIGS. 1A and 1B. It is thus considered that a high-quality, large crystal can be obtained. A crystal grown by the commonly-used method shown in (a) to (e) in each of FIGS. 22A and 22B may be inversed, and the –c-plane that is a plane opposite to the +c-plane may be used as a crystal growth plane, to use the –c-plane as a crystal growth plane as described above. Specifically, for example, a crystal 12 in the state shown in (b) or (c) in FIG. 22A ((b) or (c) in FIG. 22B) is inversed, then cut into an appropriate size, and is used as the seed crystal 11 shown in (a) in FIG. 1A ((a) in FIG. 1B). Alternatively, for example, a crystal 12 in the state shown in (b) or (c) in FIG. 22A ((b) or (c) in FIG. 22B) is inversed to be the crystal 12 in the state of (b) or (c) in FIG. 1A ((b) or (c) in FIG. 1B) and is then used as it is in the subsequent steps.

However, it is difficult to actually use a plane on the −c-plane side as a crystal growth plane. The reason for this is as follows. A phenomenon (polarity inversion) where a plane on the −c-plane side used as a crystal growth plane is inversed to be a +c-plane occurs although the reason is unknown. Accordingly, the diameter of the grown (deposited) crystal is decreasing toward the top (newly-deposited part) as shown in (a) to (e) in FIG. 22A ((a) to (e) in FIG. 22B), and it is difficult to obtain a high-quality, large crystal.

Hence, the present invention provides a method for producing a Group III element nitride crystal in which a Group III element nitride crystal is grown using a plane on the −c-plane side as a crystal growth plane. The present invention further provides a Group III element nitride crystal produced by the method for producing a Group III element nitride crystal of the present invention (hereinafter also merely referred to as "the production method of the present invention"), a semiconductor device, a method for producing the semiconductor device, and a Group III element nitride crystal production device for use in the production method of the present invention.

Means for Solving Problem

In order to achieve the aforementioned object, the present invention provides a method for producing a Group III element nitride crystal, the method including:
  a vapor phase growth step of growing a Group III element nitride crystal on a crystal growth plane of a Group III element nitride seed crystal by vapor deposition, wherein
  the vapor phase growth step is a step of causing a Group III metal, an oxidant, and a nitrogen-containing gas to react with one another to grow the Group III element nitride crystal, or
  the vapor phase growth step includes:
    a reduced product gas generation step of causing a Group III element oxide and a reducing gas to react with each other to generate a gas of a reduced product of the Group III element oxide; and
    a crystal generation step of causing the gas of the reduced product and a nitrogen-containing gas to react with each other to generate the Group III element nitride crystal,
  the crystal growth plane is a plane on −c-plane side,
  a crystal growth temperature is 1200° C. or more, and
  in the vapor phase growth step, the Group III element nitride crystal is grown in an approximately −c direction.

The present invention further provides a Group III element nitride crystal produced by the method for producing a Group III element nitride crystal of the present invention.

The present invention further provides a semiconductor device including the Group III element nitride crystal of the present invention, wherein the Group III element nitride crystal is a semiconductor.

The present invention further provides a method for producing a semiconductor device including a Group III element nitride crystal, wherein the Group III element nitride crystal is a semiconductor, and the Group III element nitride crystal is produced by the method for producing a Group III element nitride crystal of the present invention.

The present invention further provides a first Group III element nitride crystal production device for use in the method for producing a Group III element nitride crystal of the present invention, including: a vapor phase growth unit configured to grow a Group III element nitride crystal on a Group III element nitride seed crystal by vapor deposition; and a liquid raw material supply unit configured to continuously supply a liquid form of the Group III metal or the Group III element oxide to the vapor phase growth unit.

The present invention further provides a second Group III element nitride crystal production device for use in the method for producing a Group III element nitride crystal of the present invention, wherein
  the vapor phase growth step in the method is a step of causing a liquid form of a Group III metal, an oxidant, and a nitrogen-containing gas to react with one another to grow the Group III element nitride crystal,
  the Group III element nitride crystal production device includes:
    a reaction vessel;
    a Group III metal supply unit;
    an oxidant supply unit; and
    a nitrogen-containing gas supply unit,
  the Group III metal supply unit is capable of continuously supplying the Group III metal to the reaction vessel,
  the oxidant supply unit is capable of continuously supplying the oxidant to the reaction vessel,
  the nitrogen-containing gas supply unit is capable of continuously supplying the nitrogen-containing gas to the reaction vessel, and
  the Group III metal, the oxidant, and the nitrogen-containing gas are caused to react with one another in the reaction vessel to produce the Group III element nitride crystal.

The present invention further provides a third Group III element nitride crystal production device for use in the method for producing a Group III element nitride crystal of the present invention, wherein
  the vapor phase growth step in the method includes:
    a reduced product gas generation step of causing a liquid form of a Group III element oxide and a reducing gas to react with each other to generate a gas of a reduced product of the Group III element oxide; and
    a crystal generation step of causing the gas of the reduced product and a nitrogen-containing gas to react with each other to generate the Group III element nitride crystal,
  the Group III element nitride crystal production device includes:
    a reaction vessel;
    a Group III element oxide supply unit;
    a reducing gas supply unit; and
    a nitrogen-containing gas supply unit,
  the Group III element oxide supply unit is capable of continuously supplying a Group III metal to the reaction vessel,
  the reducing gas supply unit is capable of continuously supplying the reducing gas to the reaction vessel,
  the nitrogen-containing gas supply unit is capable of continuously supplying the nitrogen-containing gas to the reaction vessel, and
  in the reaction vessel, the Group III element oxide and the reducing gas are caused to react with each other to generate a gas of a reduced product of the Group III element oxide, and
  the gas of the reduced product and the nitrogen-containing gas are caused to react with each other to produce the Group III element nitride crystal. The first to third Group III element nitride crystal production devices of the present invention are hereinafter also collectively referred to as the "Group III element nitride crystal production device of the present invention".

Effects of the Invention

The method for producing a Group III element nitride crystal of the present invention can grow a Group III element nitride crystal using a plane on the −c-plane side as a crystal growth plane. The present invention can further provide a Group III element nitride crystal produced by the production method of the present invention, a semiconductor device, a method for producing the semiconductor device, and a Group III element nitride crystal production device for use in the production method of the present invention.

BRIEF DESCRIPTION OF DRAWINGS

FIG. 16 shows bird's-eye SEM images and cross-sectional SEM images of GaN crystals produced in Example 4.

DESCRIPTION OF EMBODIMENTS

Figure 1A:
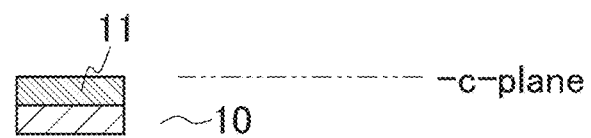
In FIG. 1A, (a) to (e) are step cross-sectional views schematically illustrating an overview of the production method of the present invention.
Figure 1A:
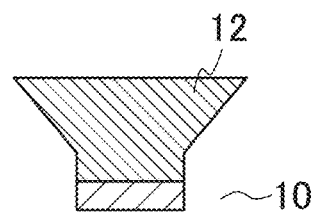
Figure 1A:
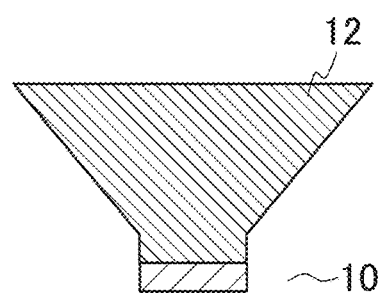
Figure 1A:
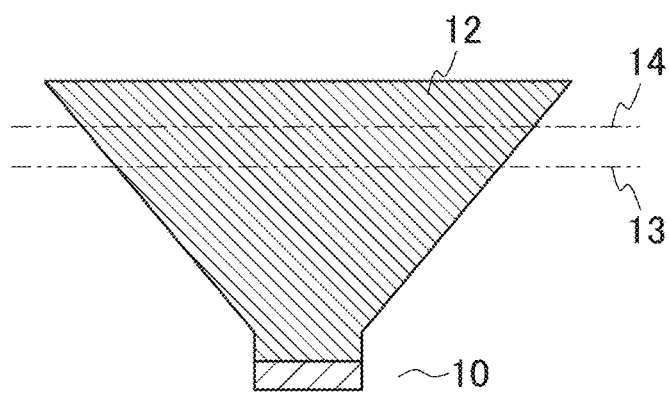
Figure 1A:

The following describes the present invention with reference to embodiments. However, the present invention is by no means limited thereto.

The present invention, for example, can be described as in the following items. It should be noted, however, that the present invention is by no means limited thereto.

(1) A method for producing a Group III element nitride crystal, the method including
  a vapor phase growth step of growing a Group III element nitride crystal on a crystal growth plane of a Group III element nitride seed crystal by vapor deposition, wherein
  the vapor phase growth step is a step of causing a Group III metal, an oxidant, and a nitrogen-containing gas to react with one another to grow the Group III element nitride crystal, or
  the vapor phase growth step includes
    a reduced product gas generation step of causing a Group III element oxide and a reducing gas to react with each other to generate a gas of a reduced product of the Group III element oxide; and
    a crystal generation step of causing the gas of the reduced product and a nitrogen-containing gas to react with each other to generate the Group III element nitride crystal,
  the crystal growth plane is a plane on −c-plane side,
  a crystal growth temperature is 1200° C. or more, and
  in the vapor phase growth step, the Group III element nitride crystal is grown in an approximately −c direction.

(2) The method according to the item (1), wherein
  the crystal growth plane of the Group III element nitride seed crystal is parallel with a −c-plane or is approximately parallel with the −c-plane.

(3) The method according to the item (1) or (2), wherein
  the crystal growth plane of the Group III element nitride seed crystal is an uneven plane.

(4) The method according to any one of the items (1) to (3), wherein
  the Group III element nitride crystal growth step is a step of causing a Group III metal, an oxidant, and a nitrogen-containing gas to react with one another to grow the Group III element nitride crystal, and
  the Group III metal is at least one selected from the group consisting of gallium, indium, and aluminium.

(5) The method according to any one of the items (1) to (4), wherein
  the Group III element nitride crystal growth step is a step of causing a Group III metal, an oxidant, and a nitrogen-containing gas to react with one another to grow the Group III element nitride crystal, and the vapor phase growth step includes:

a Group III metal oxidation product gas generation step of causing the Group III metal and the oxidant to react with each other to generate a Group III metal oxidization product gas; and a Group III element nitride crystal generation step of causing the Group III metal oxidization product gas and the nitrogen-containing gas to react with each other to generate the Group III element nitride crystal.

(6) The method according to the item (5), wherein in the Group III metal oxidation product gas generation step, the Group III metal is caused to react with the oxidant under heating.

(7) The method according to the item (5) or (6), wherein the Group III metal oxidization product gas is a Group III metal oxide gas.

(8) The method according to the item (7), wherein the Group III metal is gallium, and the Group III metal oxide gas is a $Ga_2O$ gas.

(9) The method according to any one of the items (1) to (8), wherein the vapor phase growth step is a step of causing a Group III metal, an oxidant, and a nitrogen-containing gas to react with one another to grow the Group III element nitride crystal, and the oxidant is an oxygen-containing compound.

(10) The method according to any one of the items (1) to (8), wherein the vapor phase growth step is a step of causing a Group III metal, an oxidant, and a nitrogen-containing gas to react with one another toe grow the Group III element nitride crystal, and the oxidant is an oxidizing gas.

(11) The method according to the item (10), wherein the oxidizing gas is at least one selected from the group consisting of a $H_2O$ gas, a $O_2$ gas, a $CO_2$ gas, and a CO gas.

(12) The method according to any one of the items (1) to (11), wherein the vapor phase growth step is a step of causing a Group III metal, an oxidant, and a nitrogen-containing gas to react with one another to grow the Group III element nitride crystal, and the nitrogen-containing gas is at least one selected from the group consisting of $N_2$, $NH_3$, a hydrazine gas, and an alkylamine gas.

(13) The method according to any one of items (10) to (12), wherein the proportion of the volume of the oxidizing gas in the total volume of the oxidizing gas and the nitrogen-containing gas is in the range from 0.001% to 60%.

(14) The method according to any one of the items (1) to (13), wherein the vapor phase growth step is a step of causing a Group III metal, an oxidant, and a nitrogen-containing gas to react with one another to grow the Group III element nitride crystal, and in the crystal growth step, the reaction is performed in the presence of a reducing gas in a reaction system.

(15) The method according to the item (14), wherein the reducing gas is a hydrogen-containing gas.

(16) The method according to the item (14), wherein the reducing gas is at least one selected from the group consisting of a $H_2$ gas, a carbon monoxide (CO) gas, a hydrocarbon gas, a $H_2S$ gas, SO2 gas, and a $NH_3$ gas.

(17) The method according to the item (16), wherein the hydrocarbon gas is at least one of a methane gas or an ethane gas.

(18) The method according to any one of the items (14) to (17), wherein the oxidant is the oxidizing gas according to the item (10) or (11), and the reducing gas is mixed with the oxidizing gas.

(19) The method according to any one of the items (14) to (18), wherein the reducing gas is mixed with the nitrogen-containing gas.

(20) The method according to any one of the items (14) to (19), wherein the reaction in the presence of a reducing gas is performed at 650° C. or more.

(21) The method according to any one of the items (1) to (20), wherein the vapor phase growth step is a step of causing a Group III metal, an oxidant, and a nitrogen-containing gas to react with one another to grow the Group III element nitride crystal, and in the vapor phase growth step, the Group III element nitride crystal is generated under pressure.

(22) The method according to any one of the items (1) to (3), wherein the vapor phase growth step includes:

a reduced product gas generation step of causing a Group III element oxide and a reducing gas to react with each other to generate a gas of a reduced product of the Group III element oxide; and a crystal generation step of causing the gas of the reduced product and a nitrogen-containing gas to react with each other to generate the Group III element nitride crystal, and in the reduced product gas generation step, the Group III element oxide is caused to react with the reducing gas under heating.

(23) The method according to any one of the items (1) to (3) and (22), wherein the vapor phase growth step includes:

a reduced product gas generation step of causing a Group III element oxide and a reducing gas to react with each other to generate a gas of a reduced product of the Group III element oxide; and a crystal generation step of causing the gas of the reduced product and a nitrogen-containing gas to react with each other to generate the Group III element nitride crystal, the Group III element oxide is $Ga_2O_3$, the gas of the reduced product is $Ga_2O$ gas, and the Group III element nitride crystal is a GaN crystal.

(24) The method according to any one of the items (1) to (3), (22) and (23), wherein the vapor phase growth step includes:

a reduced product gas generation step of causing a Group III element oxide and a reducing gas to react with each other to generate a gas of a reduced product of the Group III element oxide; and a crystal generation step of causing the gas of the reduced product and a nitrogen-containing gas to react with each other to generate the Group III element nitride crystal, and the reduced product gas generation step is performed in an atmosphere of a mixed gas of the reducing gas and an inactive gas.

(25) The method according to the item (24), wherein
the proportion of the reducing gas in the total amount of the mixed gas is 3% or more to less than 100 vol %, and
the proportion of the inactive gas in the total amount of the mixed gas is more than 0 to 97 vol % or less.

(26) The method according to the item (24) or (25), wherein
the inactive gas includes nitrogen gas.

(27) The method according to any one of the items (1) to (3) and (22) to (26), wherein
the vapor phase growth step includes:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal, and
the reducing gas includes a hydrogen gas.

(28) The method according to any one of the items (1) to (3) and (22) to (27), wherein
the vapor phase growth step includes:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal, and
the nitrogen-containing gas includes an ammonia gas.

(29) The method according to any one of the items (1) to (3) and (22) to (28), wherein
the vapor phase growth step includes:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal, and
the crystal generation step is performed under pressure.

(30) The method according to any one of the items (1) to (29), further including:
a slicing step of slicing the Group III element nitride crystal to cut at least one Group III element nitride crystal substrate out.

(31) The method according to the item (30), wherein
the at least one Group III element nitride crystal substrate cut out in the slicing step is used as the Group III element nitride seed crystal in the vapor phase growth step.

(32) The method according to the item (31), wherein
the slicing step and the vapor phase growth step that uses the at least one Group III element nitride crystal substrate cut out in the slicing step as the Group III element nitride seed crystal are performed repeatedly.

(33) The method according to any one of the items (1) to (32), wherein
the Group III element nitride crystal to be produced is represented by $Al_xGa_yIn_{1-x-y}N$ ($0 \le x \le 1$, $0 \le y \le 1$, $x+y \le 1$).

(34) The method according to any one of the items (1) to (32), wherein
the Group III element nitride crystal to be produced is GaN.

(35) The method according to any one of the items (1) to (34), wherein
the Group III element nitride crystal to be produced has a major axis of 15 cm or more.

(36) The method according to any one of the items (1) to (35), wherein
the Group III element nitride crystal to be produced has a dislocation density of $1.0 \times 10^7$ cm$^{-2}$ or less.

(37) The method according to any one of the items (1) to (36), wherein
in the Group III element nitride crystal to be produced, a half width of each of a symmetric reflection component (002) and an asymmetric reflection component (102) by an X-ray rocking curve analysis (XRC) is 300 seconds or less.

(38) The method according to any one of the items (1) to (37), wherein
the Group III element nitride crystal to be produced has an oxygen concentration of $1 \times 10^{20}$ cm$^{-3}$ or less.

(39) The method according to any one of the items (1) to (38), wherein
the Group III element nitride seed crystal is produced by liquid deposition.

(40) A Group III element nitride crystal produced by the method according to any one of the items 1 to 39.

(41) A semiconductor device including the Group III element nitride crystal according to the item (40), wherein
the Group III element nitride crystal is a semiconductor.

(42) A method for producing a semiconductor device including a Group III element nitride crystal, wherein
the Group III element nitride crystal is a semiconductor, and
the Group III element nitride crystal is produced by the method according to any one of the items (1) to (39).

(43) A Group III element nitride crystal production device for use in the method according to any one of the items (1) to (39), including:
a vapor phase growth unit configured to grow a Group III element nitride crystal on a Group III element nitride seed crystal by vapor deposition; and
a liquid raw material supply unit configured to continuously supply a liquid form of the Group III metal or the Group III element oxide to the vapor phase growth unit.

(44) A Group III element nitride crystal production device for use in the method according to any one of the items (1) to (39), wherein
the vapor phase growth step in the method is a step of causing a liquid form of a Group III metal, an oxidant, and a nitrogen-containing gas to react with one another to grow the Group III element nitride crystal,
the Group III element nitride crystal production device includes:
a reaction vessel;
a Group III metal supply unit;
an oxidant supply unit; and
a nitrogen-containing gas supply unit,
the Group III metal supply unit is capable of continuously supplying the Group III metal to the reaction vessel,
the oxidant supply unit is capable of continuously supplying the oxidant to the reaction vessel,
the nitrogen-containing gas supply unit is capable of continuously supplying the nitrogen-containing gas to the reaction vessel, and
the Group III metal, the oxidant, and the nitrogen-containing gas are caused to react with one another in the reaction vessel to produce the Group III element nitride crystal.

(45) A Group III element nitride crystal production device for use in the method according to any one of the items (1) to (39), wherein
the vapor phase growth step in the method includes:
a reduced product gas generation step of causing a liquid form of a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal,
the Group III element nitride crystal production device includes:
a reaction vessel;
a Group III element oxide supply unit;
a reducing gas supply unit; and
a nitrogen-containing gas supply unit,
the Group III element oxide supply unit is capable of continuously supplying a Group III metal to the reaction vessel,
the reducing gas supply unit is capable of continuously supplying the reducing gas to the reaction vessel,
the nitrogen-containing gas supply unit is capable of continuously supplying the nitrogen-containing gas to the reaction vessel, and
in the reaction vessel, the Group III element oxide and the reducing gas are caused to react with each other to generate a gas of a reduced product of the Group III element oxide, and
the gas of the reduced product and the nitrogen-containing gas are caused to react with each other to produce the Group III element nitride crystal.

(1. Method for Producing Group III Element Nitride Crystal)

The following describes a production method of the present invention in more detail.

(1-1 Crystal Growth Condition and the Like)

Figure 1B:
In FIG. 1B, (a) to (e) are perspective views of the respective steps shown in (a) to (e) in FIG. 1A.
Figure 1B:
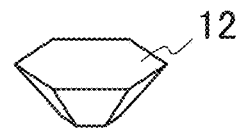
Figure 1B:
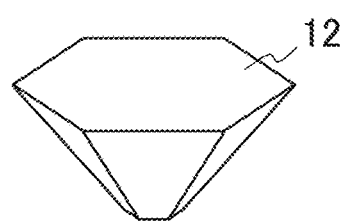
Figure 1B:
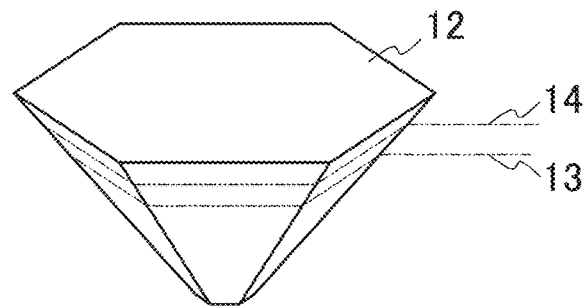
Figure 1B:
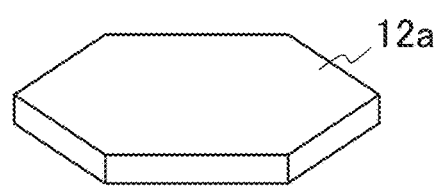

The production method of the present invention can be performed as in the step cross-sectional views of (a) to (e) in FIG. 1A and perspective views of (a) to (e) in FIG. 1B, for example. That is, first, as shown in (a) in FIG. 1A, a Group III element nitride seed crystal 11 is disposed on a substrate 10. The material of the substrate 10 is not limited to particular materials and preferably contains, for example, at least one selected from the group consisting of an oxide of $Al_xGa_yIn_{1-x-y}N$ ($0 \le x \le 1$, $0 \le y \le 1$, $x+y \le 1$), diamond-like carbon, silicon nitride, silicon oxide, silicon oxynitride, aluminium oxide, aluminium oxynitride, silicon carbide, yttrium oxide, yttrium aluminium garnet (YAG), tantalum, rhenium, and tungsten. Examples of the material of the substrate 10 further include sapphire, Group III nitride, gallium arsenide (GaAs), silicon (Si), silicon carbide (SiC), magnesium oxide (MgO), zinc oxide (ZnO), gallium phosphide (GaP), zirconium diboride ($ZrB_2$), lithium dioxogallate ($LiGaO_2$), BP, $MoS_2$, $LaAlO_3$, NbN, $MnFe_2O_4$, $ZnFe_2O_4$, ZrN, TiN, $MgAl_2O_4$, $NdGaO_3$, $LiAlO_2$, $ScAlMgO_4$, and $Ca_8La_2(PO_4)_6O_2$. Among them, sapphire is particularly preferable in terms of the cost and the like. Alternatively, the material of the substrate 10 may be a Group III nitride as mentioned above, and in this case, the substrate 10 itself may also serve as the Group III element nitride seed crystal 11. The material of the Group III element nitride seed crystal 11 may be identical to or different from and is preferably the same as that of a Group III element nitride crystal 12 to be grown thereon.

The Group III element nitride crystal 12 is then grown from the seed crystal 11 as shown in (b) in each of FIGS. 1A and 1B. The crystal 12 is then further grown to be big as shown in (c) to (d) in each of FIGS. 1A and 1B. The crystal 12 is thereafter laterally sliced along dotted lines 13 and 14 as shown in (d) in each of FIGS. 1A and 1B. Thus, a plate-like Group III element nitride crystal substrate 12a can be obtained as shown in (e) in each of FIGS. 1A and 1B.

Figure 22A:
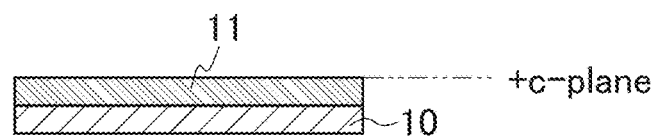
In FIG. 22A, (a) to (e) are step cross-sectional views schematically illustrating an overview of a commonly-used method for producing a Group III element nitride crystal.
Figure 22A:
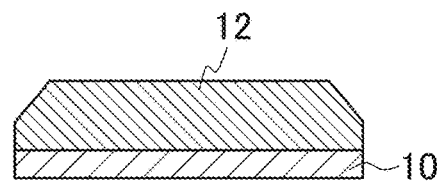
Figure 22A:
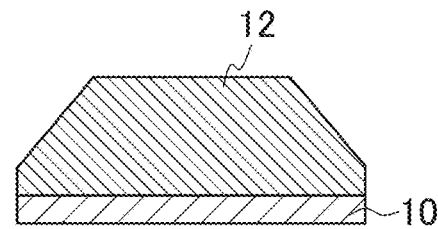
Figure 22A:
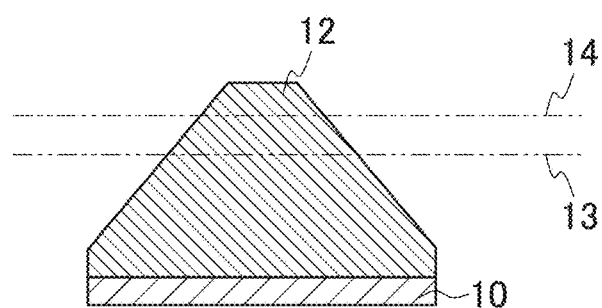
Figure 22A:
Figure 22B:
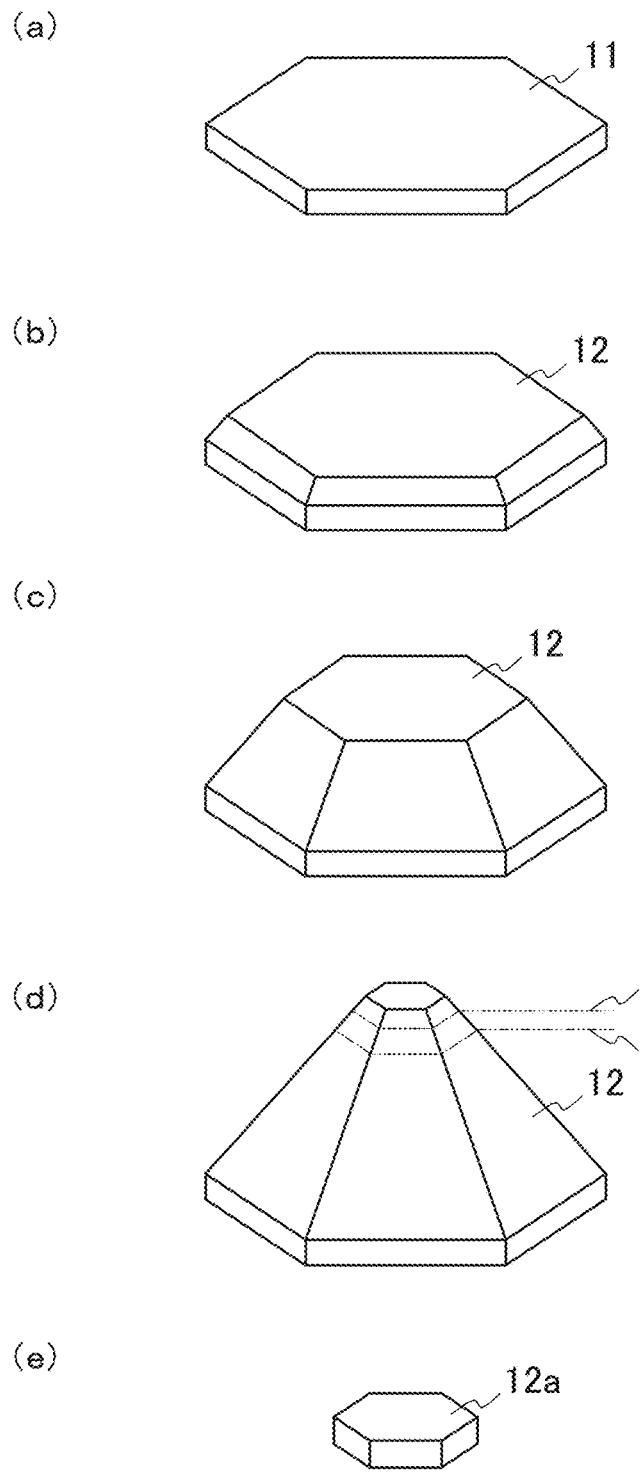
In FIG. 22B, (a) to (e) are perspective views of the respective steps shown in (a) to (e) in FIG. 22A.

In the use of a −c-plane as a crystal growth plane of the seed crystal 11, for example, a crystal grown by a commonly-used method may be inversed as mentioned above, and the −c-plane that is a plane on the inverse side may be used as a crystal growth plane. Specifically, for example, the crystal 12 in the state of (b) or (c) in FIG. 22A ((b) or (c) in FIG. 22B) may be inversed and then cut into an appropriate size to obtain a seed crystal 11 of (a) in FIG. 1A ((a) in FIG. 1B). Alternatively, the crystal 12 in the state of (b) or (c) in FIG. 22A ((b) or (c) in FIG. 22B) may be inversed and used as it is in the subsequent steps The production method of the present invention, for example, allows the diameter of the Group III element nitride crystal 12 to increase as growing as described in the step drawings in FIGS. 1A and 1B. Accordingly, it is possible to obtain a high-quality Group III element nitride crystal having a small density of crystal defect (with less crystal defects per unit area of the Group III element nitride crystal 12), derived from the seed crystal 11 (taken over from the seed crystal 11), for example.

As mentioned above, the crystal growth temperature in the vapor phase growth step of the production method of the present invention is 1200° C. or more. The crystal growth plane thus can be prevented from being inverted from the −c-plane to the +c-plane, and a Group III element nitride crystal can be grown on the −c-plane. Therefore, a high-quality, large Group III element nitride crystal can be produced, for example. The crystal growth temperature is preferably 1300° C. or more, yet more preferably 1400° C. or more, particularly preferably 1500° C. or more. The upper limit of the crystal growth temperature is not limited to particular temperatures and is, for example, 2000° C. or less.

The crystal growth rate in the vapor phase growth step is not limited to particular rates and is preferably not too high, which further prevents the phenomenon (polarity inversion) where the crystal growth plane is inverted from the −c-plane to the +c-plane. The crystal growth rate is not limited to particular rates and is, for example, 2 mm/h or less, preferably 200 μm/h or less, more preferably 50 μm/h or less as a thickness increase rate of the Group III element nitride crystal per 1 hour, assuming that the crystal growth temperature is 1200° C. or more and less than 1250° C. The crystal growth rate is, for example, 3 mm/h or less, preferably 300 μm/h or less, more preferably 30 μm/h or less, assuming that the crystal growth temperature is 1250° C. or more and less than 1300° C. The crystal growth rate is, for example, 4 mm/h or less, preferably 400 μm/h or less, more preferably 40 μm/h or less, assuming that the crystal growth temperature is 1300° C. or more and less than 1400° C. The crystal growth rate is, for example, 5 mm/h or less, preferably 500 μm/h or less, more preferably 50 μm/h or less, assuming that the crystal growth temperature is 1400° C. or more. The lower limit of the crystal growth rate is not limited to particular rates and is preferably 10 μm/h to increase crystal production efficiency.

Figure 2:
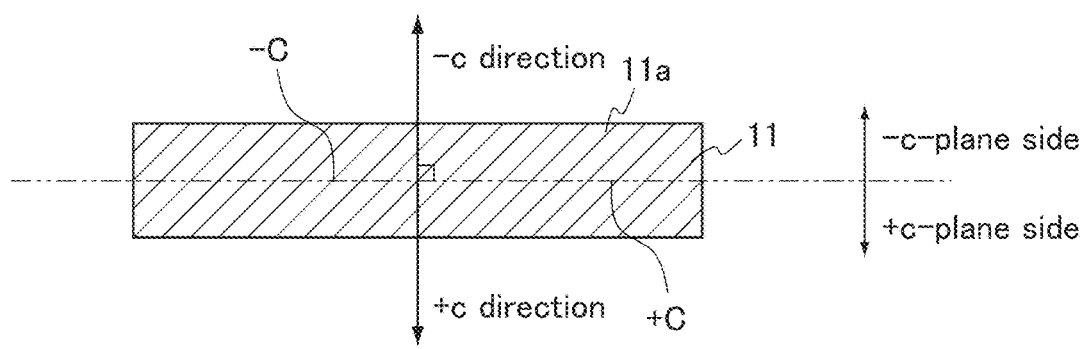
FIG. 2 is a cross-sectional view schematically illustrating a structure of a Group III element nitride seed crystal for use in the production method of the present invention.

In the production method of the present invention, the crystal growth plane of the Group III element nitride seed crystal is, as mentioned above, a plane on the −c-plane side. Moreover, as mentioned above, the Group III element nitride crystal is grown in an approximately −c direction in the vapor phase growth step. The following describes that the crystal growth plane is the "plane on the −c-plane side", and the growth direction of the Group III element nitride crystal is an "approximately −c direction" with reference to the drawings. FIG. 2 is a cross-sectional view schematically illustrating a structure of a Group III element nitride seed crystal for use in the production method of the present invention. As shown in FIG. 2, a seed crystal 11 has a c-plane (a plane perpendicular to the plane of the paper along the dotted line of FIG. 2 or a plane parallel therewith). As shown in FIG. 2, the c-plane has a −c-plane side (the upper side of the paper) and +c-plane side (the lower side of the paper). In the present invention, a plane 11a on the −c-plane side on the surface of the seed crystal 11 is used as a crystal growth plane. In the vapor phase growth step, the Group III element nitride crystal is grown in an approximately −c direction, i.e., the −c direction (a direction perpendicular to the −c-plane and toward the −c-plane side) or a direction approximately agreeing with the −c direction.

In the present invention, the state of the "approximately −c direction" as the growth direction of the Group III element nitride crystal, i.e., the state of "a direction approximately agreeing with" the −c direction is not limited to particular states and is the state of an angle formed between the growth direction of the crystal and the −c direction of, for example, 10° or less, preferably 5° or less, more preferably 3° or less, yet more preferably 1° or less and is ideally the state of the angle of 0° (i.e., the growth direction of the crystal completely agreeing with the −c direction). In the present invention, the crystal growth plane of the Group III element nitride seed crystal may completely agree with the −c-plane or may be a plane approximately parallel with the −c-plane, for example. On such crystal growth plane, the Group III element nitride crystal is easily grown in the −c direction (a direction approximately perpendicular to the −c-plane). FIG. 2 shows an example where the crystal growth plane 11a is approximately parallel with the −c-plane. In the present invention, the state where the crystal growth plane is "approximately parallel" with the −c-plane is not limited to particular states and is a state of an angle formed between the crystal growth plane and the −c-plane of, for example, 10° or less, preferably 5° or less, more preferably 3° or less, yet more preferably 1° or less and is ideally the state of the angle of 0° (i.e., the crystal growth plane completely agreeing with the −c-plane).

Figure 3:
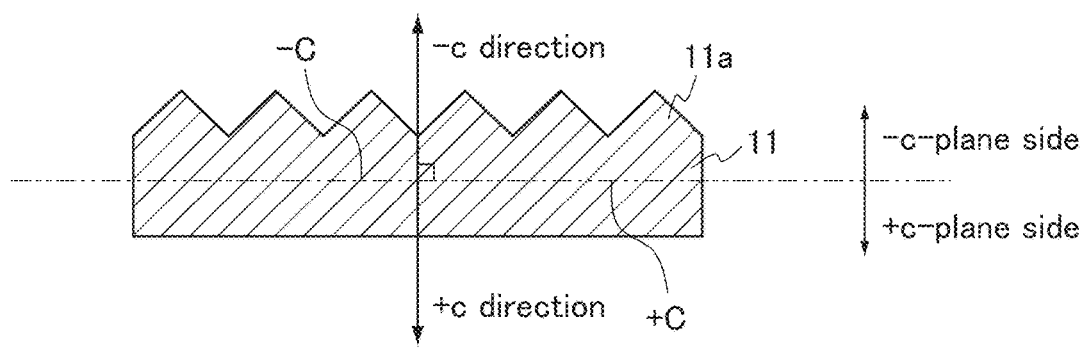
FIG. 3 is a cross-sectional view schematically illustrating another structure of a Group III element nitride seed crystal for use in the production method of the present invention.

In the production method of the present invention, the crystal growth plane of the Group III element nitride seed crystal may be an uneven plane. FIG. 3 is a cross-sectional view of such a Group III element nitride seed crystal. FIG. 3 is the same as FIG. 2 except that the crystal growth plane 11a in the Group III element nitride seed crystal 11 has asperities. In FIG. 3, the asperities in the crystal growth plane 11a have, as shown in FIG. 3, planes largely tilted with respect to the −c-plane. The entire crystal growth plane 11a, however, is approximately parallel with the −c-plane. Even when the crystal growth plane of the Group III element nitride seed crystal is an uneven plane in the production method of the present invention as described above, the entire crystal growth plane is preferably approximately parallel with the −c-plane. The shapes of the asperities are not limited to those in FIG. 3 and may be any shapes.

In the crystal growth plane of the Group III element nitride seed crystal, the plane on the −c-plane side (e.g., the −c-plane or a plane approximately parallel with the −c-plane) may be partially inverted to a plane on the +c-plane side by polarity inversion. The proportion of the plane whose polarity is inverted is preferably 50% or less, more preferably 30% or less, yet more preferably 10% or less, ideally 0 in the entire area of the crystal growth plane of the Group III element nitride seed crystal. The present invention can prevent the polarity inversion of the crystal growth plane in crystal growth, and however, the polarity inversion may occur in crystal growth. The proportion of the plane whose polarity is inverted is preferably 50% or less, more preferably 30% or less, yet more preferably 10% or less, ideally 0, in, for example, the entire area of a plane 11 μm deposited (grown) on the crystal growth plane of the Group III element nitride seed crystal.

In the present invention, the Group III element nitride seed crystal for use in the vapor phase growth step may be produced by liquid deposition. The liquid deposition is not limited to particular methods, and a Group III element nitride crystal (the Group III element nitride seed crystal for use in the vapor phase growth step) may be produced by, for example, bringing the surface of a Group III element nitride seed crystal for use in the liquid deposition into contact with an alkali metal (e.g., sodium) melt to cause, in an atmosphere containing nitrogen, a Group III element and the nitrogen to react with each other in the alkali metal melt. More specifically, for example, any method described in JP 2002-293696 A, Japanese Patent No. 4588340, and WO 2013/105618 may be used, as appropriate, as the liquid deposition. For example, as described in WO 2013/105618, a Group III element nitride crystal (the Group III element nitride seed crystal for use in the vapor phase growth step) may be produced using a plurality of Group III nitride crystals (Group III element nitride crystals) as seed crystals. Accordingly, for example, a high-quality, large Group III element nitride crystal with less defects can be produced. By the use of this Group III element nitride crystal as the Group III element nitride seed crystal for use in the vapor phase growth step, a high-quality, large Group III element nitride crystal with less defects such as distortion, dislocation, and warping can be produced.

In the production method of the present invention, the vapor phase growth step is, as mentioned above, the following vapor phase growth step (A) or (B). The vapor phase growth step (A) is a step of causing a Group III metal, an oxidant, and a nitrogen-containing gas to react with one another to grow the Group III element nitride crystal. The vapor phase growth step (B) includes: a reduced product gas generation step of causing a Group III element oxide and a reducing gas to react with each other to generate a gas of a reduced product of the Group III element oxide; and a crystal generation step of causing the gas of the reduced product and a nitrogen-containing gas to react with each other to generate the Group III element nitride crystal.

In the vapor phase growth step (A) of the production method of the present invention, the Group III metal is preferably at least one selected from the group consisting of gallium, indium, and aluminium, particularly preferably gallium.

It is preferred that the vapor phase growth step (A) in the production method of the present invention includes a Group III metal oxidation product gas generation step of causing the Group III metal and the oxidant to react with each other to generate a Group III metal oxidization product gas; and a Group III element nitride crystal generation step of causing the Group III metal oxidization product gas and the nitrogen-containing gas to react with each other to generate the Group III element nitride crystal.

It is further preferred that the Group III metal is caused to react with the oxidant under heating in the Group III metal oxidation product gas generation step. Furthermore, it is further preferred that the Group III metal oxidization product gas is a Group III metal oxide gas. In this case, it is further preferred that the Group III metal is gallium, and the Group III metal oxidization product gas is a $Ga_2O$ gas.

The oxidant in the vapor phase growth step (A) is preferably an oxygen-containing compound or an oxidizing gas.

The oxidizing gas in the vapor phase growth step (A) is preferably at least one selected from the group consisting of a $H_2O$ gas, an $O_2$ gas, a $CO_2$ gas, and a CO gas, particularly preferably an $H_2O$ gas.

The nitrogen-containing gas in the vapor phase growth step (A) is preferably at least one selected from the group consisting of $N_2$, $NH_3$, a hydrazine gas, and an alkylamine gas.

In the vapor phase growth step (A), the volume of the oxidizing gas is not limited to particular volumes, and the proportion of the volume of the oxidizing gas in the total volume of the oxidizing gas and the nitrogen-containing gas is, for example, more than 0% to less than 100%, preferably 0.001% or more to less than 100%, more preferably 0.01% to 95%, yet more preferably 0.1% to 80%, yet more preferably 0.1% to 60%.

In the vapor phase growth step (A), the reaction is preferably performed in the presence of a reducing gas in a reaction system. The reducing gas is preferably a hydrogen-containing gas, more preferably at least one selected from the group consisting of an $H_2$ gas, a carbon monoxide (CO) gas, a hydrocarbon gas, an $H_2S$ gas, an $SO_2$ gas, and an $NH_3$ gas. The hydrocarbon gas is preferably at least one of a methane gas or an ethane gas. It is more preferred that the oxidant is the oxidizing gas, and the reducing gas is mixed with the oxidizing gas in the crystal growth step (A).

In the Group III element nitride crystal growth step, the reaction in the presence of a reducing gas is preferably performed at 650° C. or more.

In the vapor phase growth step (A), the Group III element nitride crystal may be generated under pressure or reduced pressure or without pressurization and depressurization.

In the reduced product gas generation step in the vapor phase growth step (B) of the production method of the present invention, the Group III element oxide is then preferably caused to react with the gas of the reduced product under heating.

It is preferred that, in the vapor phase growth step (B), the Group III element oxide is $Ga_2O_3$, the gas of the reduced product is $Ga_2O$ gas, and the Group III element nitride crystal is a GaN crystal.

The reduced product gas generation step in the vapor phase growth step (B) is preferably performed in an atmosphere of a mixed gas of a reducing gas and an inactive gas. It is preferred that the proportion of the reducing gas in the total amount of the mixed gas is 3% or more to less than 100 vol %, and the proportion of the inactive gas in the total amount of the mixed gas is more than 0 to 97 vol % or less. It is more preferred that the inactive gas includes nitrogen gas.

In the vapor phase growth step (B), the reducing gas preferably includes a hydrogen gas.

In the vapor phase growth step (B), the nitrogen-containing gas preferably includes an ammonia gas The crystal generation step in the vapor phase growth step (B) may be performed under pressure or reduced pressure or without pressurization and depressurization, for example.

The production method of the present invention may or may not include a step(s) in addition to the vapor phase growth step, as appropriate. Specifically, for example, the production method of the present invention may or may not further include a step (liquid phase growth step) of producing the Group III element nitride seed crystal for use in the vapor phase growth step by liquid deposition.

The production method of the present invention preferably further includes a slicing step of slicing the Group III element nitride crystal to cut at least one Group III element nitride crystal substrate out.

In the production method of the present invention, the Group III element nitride crystal is preferably represented by $Al_xGa_yIn_{1-x-y}N$ ($0 \leq x \leq 1$, $0 \leq y \leq 1$, $x+y \leq 1$) and is particularly preferably GaN.

In the production method of the present invention, the length of the major axis of the Group III element nitride crystal to be produced is not limited to particular lengths and is preferably 15 cm or more. The dislocation density of the Group III element nitride crystal to be produced is also not limited to particular densities and is preferably $1.0 \times 10^7$ cm$^{-2}$ or less. Moreover, the half width by X ray rocking curve analysis (XRC) in the Group III element nitride crystal to be produced is not limited to particular values, and a half width of each of a symmetric reflection component (002) and an asymmetric reflection component (102) is preferably 300 seconds or less. Furthermore, the oxygen concentration in the Group III element nitride crystal to be produced may be $1 \times 10^{20}$ cm$^{-3}$ or less. The present invention, however, is by no means limited thereto, and the oxygen concentration in the Group III element nitride crystal may be more than $1 \times 10^{20}$ cm$^{-3}$.

(1-2. Vapor Deposition Step (Vapor Deposition) and Group III Element Nitride Crystal Production Device)

The following describes specific conditions of the vapor phase growth step (vapor deposition) and the Group III element nitride crystal production device of the present invention for use in the vapor phase growth step (vapor deposition) with reference to examples.

As mentioned above, in the vapor phase growth step, a Group III element nitride crystal is grown on a crystal growth plane of a Group III element nitride seed crystal by vapor deposition. The crystal growth plane is a –c-plane or a plane approximately parallel with the –c-plane. The vapor phase growth step is, as mentioned above, the vapor phase growth step (A) or the vapor phase growth step (B). The vapor phase growth step (A) is, as mentioned above, a step of causing a Group III metal, an oxidant, and a nitrogen-containing gas to react with one another to grow the Group III element nitride crystal. The vapor phase growth step (B) includes, as mentioned above, a reduced product gas generation step of causing a Group III element oxide and a reducing gas to react with each other to generate a gas of a reduced product of the Group III element oxide and a crystal generation step of causing the gas of the reduced product and a nitrogen-containing gas to react with each other to generate the Group III element nitride crystal. Other than this, the vapor phase growth steps (A) and (B) are not limited to particular steps and may be, for example, a commonly-used vapor deposition. The following describes examples of the vapor phase growth steps (A) and (B).

(1-2-1. Group III Element Nitride Crystal Production Device Using Vapor Deposition)

Figure 4:
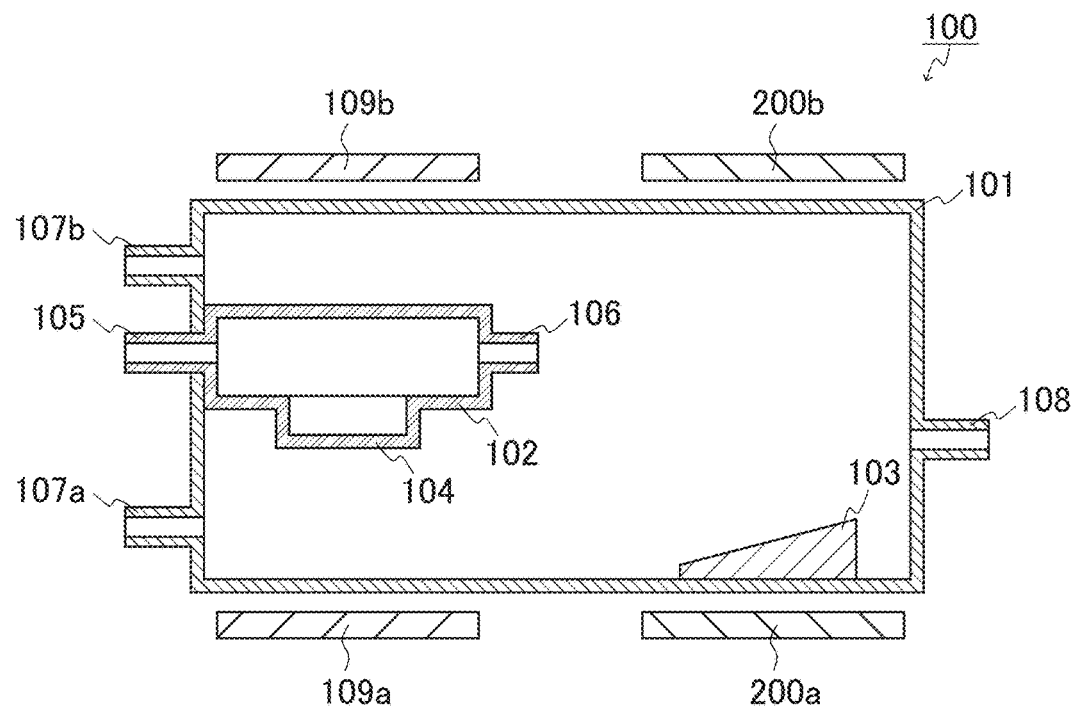
FIG. 4 is a cross-sectional view schematically illustrating a Group III element nitride crystal production device of the present invention.

FIG. 4 shows a configuration of a production device for use in the vapor phase growth step (A) (Group III element nitride crystal production device using vapor deposition). In FIG. 4, the size, the ratio, and the like of components are different from actual ones to make it clear understandable. As shown in FIG. 4, the present production device 100 includes a first container 101, a second container 102, and a substrate support 103, and the second container 102 and the substrate support 103 are disposed inside the first container 101. The second container 102 is fixed on the left side surface of the first container 101 in FIG. 4. The substrate support 103 is fixed on the lower surface of the first container 101. The second container 102 includes a Group III metal placement portion 104 on its lower surface. The second container 102 includes an oxidizing gas introduction tube 105 on its left side surface and a Group III metal oxidization product gas delivery tube 106 on its right side surface in FIG. 4. An oxidizing gas can be continuously introduced (supplied) into the second container 102 through the oxidizing gas introduction tube 105. The first container 101 includes nitrogen-containing gas introduction tubes 107a and 107b on its left side surface and an exhaust tube 108 on its right side surface in FIG. 4. A nitrogen-containing gas can be continuously introduced (supplied) into the first container 101 through the nitrogen-containing gas introduction tubes 107a and 107b. First heating units 109a and 109b and second heating units 200a and 200b are further disposed outside the first container. The production device for use in the production method of the present invention, however, is by no means limited thereto. For example, in the present production device, only one second container 102 is disposed inside the first container 101. However, a plurality of second containers 102 may be disposed inside the first container 101. Moreover, the present production device includes only one oxidizing gas introduction tube 105 and may however include a plurality of oxidizing gas introduction tubes 105. The production device 100 of FIG. 4 is described above as the production device for use in the vapor phase growth step (A) and can be used in the vapor phase growth step (B) as mentioned below.

The shape of the first container is not limited to particular shapes, and examples thereof include a cylindrical shape, a quadrangular prism shape, a triangular prism shape, and combinations thereof. Examples of a material for forming the first container include quartz, alumina, aluminium titanate, mullite, tungsten, and molybdenum. The first container may be a self-made container or a commercially available container. The commercially available container as the first container can be, for example, a quartz reaction tube. The quartz reaction tube can be, for example, produced by PHOENIX TECHNO.

The shape of the second container is not limited to particular shapes, and examples thereof include those described for the first container. Examples of the material for forming the second container include quartz, tungsten, stainless, molybdenum, aluminium titanate, mullite, and alumina. The second container may be a self-made container or a commercially available container. The commercially available container as the second container can be, for example, "SUS316BA tube" (product name) produced by Mecc Technica Co.

As each of the first heating units and the second heating units, a conventionally-known heating unit can be used. Examples of the heating units include ceramic heaters, high frequency heating equipment, resistance heaters, and light concentrating heaters. These heating units may be used alone or in a combination of two or more of them. The first heating units and the second heating units preferably are controlled separately.

Figure 6:
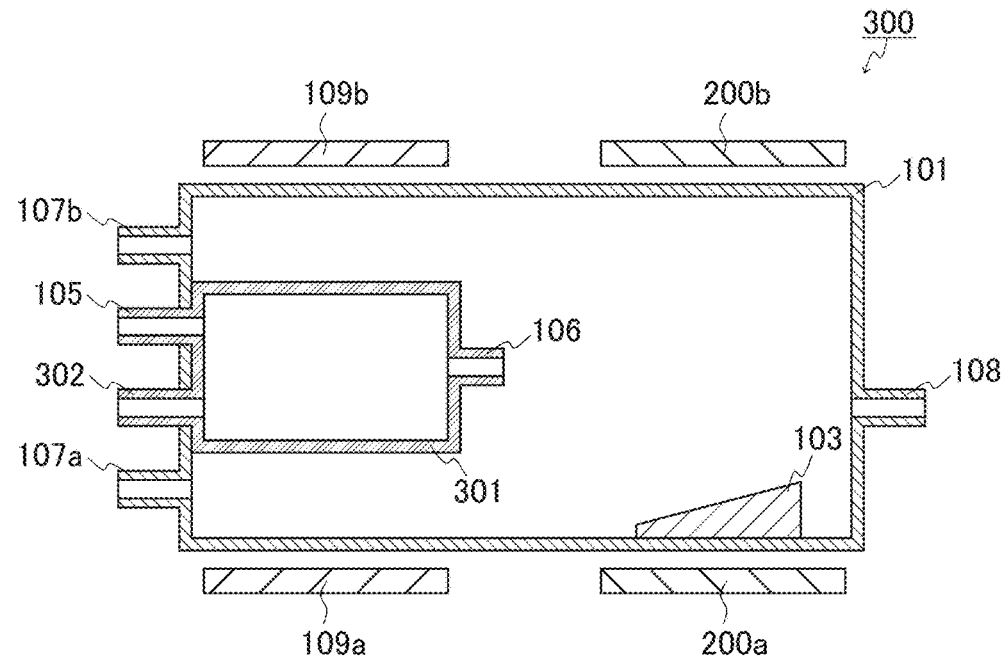
FIG. 6 is a cross-sectional view schematically illustrating another Group III element nitride crystal producing device of the present invention.

FIG. 6 shows another configuration of the production device for use in the vapor phase growth step (A). As shown in FIG. 6, this production device 300 is the same as the production device 100 of FIG. 4 except that the production device 300 includes a second container 301 as a substitute for the second container 102. As shown in FIG. 6, the second container 301 includes an oxidizing gas introduction tube 105 on its upper left side surface, a Group III metal introduction tube 302 on its lower left side surface, and a Group III metal oxidization product gas delivery tube 106 on its right side surface. An oxidizing gas can be continuously introduced (supplied) into the second container 301 through the oxidizing gas introduction tube 105. A Group III metal can be continuously introduced (supplied) into the second container 301 through the Group III metal introduction tube 302. The second container 301 does not include a Group III metal placement portion 104 and instead has a large depth (vertical width) and thus can store the Group III metal in its lower portion. In the production device of FIG. 6, the first container 101 and the second container 301 each can be referred to as a "reaction vessel". The Group III metal introduction tube 302 corresponds to a "Group III metal supply unit". The oxidizing gas introduction tube 105 can also be referred to as an "oxidant supply unit". The nitrogen-containing gas introduction tubes 107a and 107b each can be referred to as a "nitrogen-containing gas supply unit". In the production device for use in the vapor phase growth step (the Group III element nitride crystal production device using vapor deposition) in the present invention, the Group III metal can be continuously supplied into the reaction vessel by the Group III metal supply unit, the oxidant can be continuously supplied into the reaction vessel by the oxidant supply unit, the nitrogen-containing gas can be continuously supplied into the reaction vessel by the nitrogen-containing gas supply unit, and the Group III metal, the oxidant, and the nitrogen-containing gas are caused to react with one another in the reaction vessel to produce a Group III element nitride crystal, as in the production device of FIG. 6, for example.

It can be said that the production device (e.g., the production device shown in FIG. 4 or 6) for use in the vapor phase growth step (A) corresponds to the "vapor phase growth unit" in the Group III element nitride crystal production device of the present invention, for example. The production device for use in the vapor phase growth step is not limited by the configurations shown in FIGS. 4 and 6. For example, the production device may not include the heating units 109a, 109b, 200a, and 200b and the substrate support 103. However, in terms of reactivity and operability, the production device preferably includes these components. The production device for use in the production method of the present invention may include other components in addition to the above-mentioned components. Examples of the other components include a unit that controls the temperatures of the first heating unit and the second heating unit and a unit that adjusts the pressure and the introduction amounts of the gasses used in the steps.

The production device for use in the vapor phase growth step (A) can be produced by assembling the above-mentioned components and other components as required according to a conventionally-known method, for example.

(1-2-2. Production Steps, Reaction Conditions, and the Like in Vapor Phase Growth Step (A))

The following describes steps, reaction conditions, raw materials to be used, and the like in the vapor phase growth step (A). The present invention, however, is by no means limited thereto. The following describes an embodiment of performing the vapor phase growth step (A) using the production device of FIG. 4 or 6.

Figure 5:
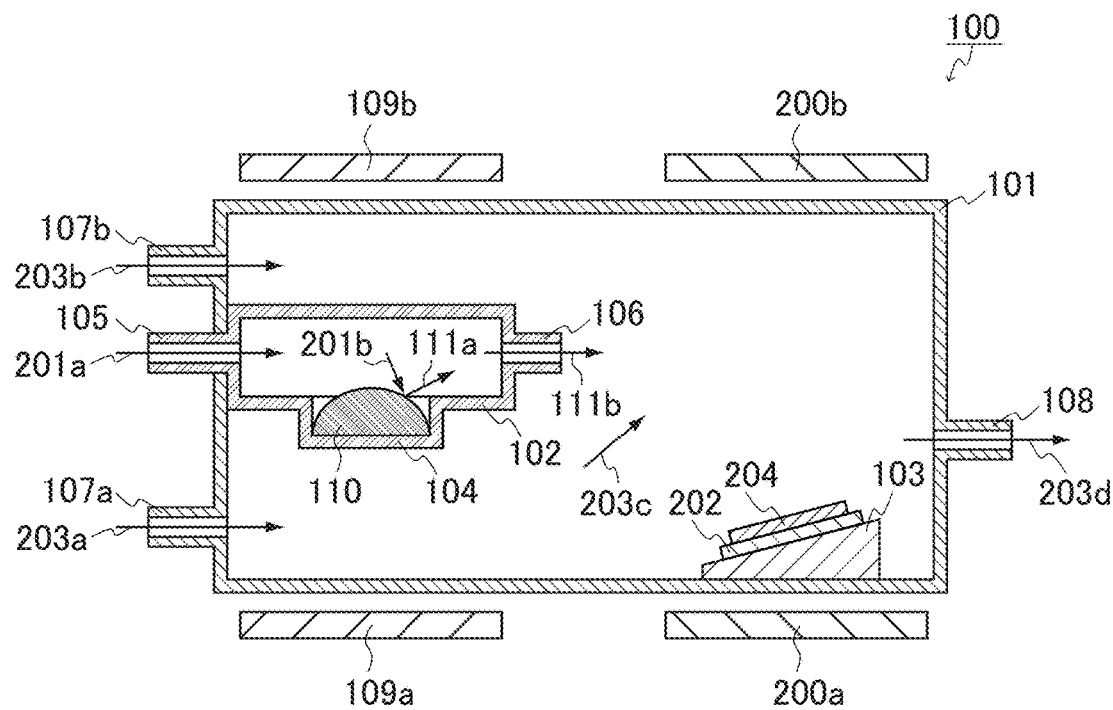
FIG. 5 is a cross-sectional view schematically illustrating an overview of the production method of the present invention using the device of FIG. 4.

As shown in FIG. 5 (or FIG. 7), a substrate 202 is previously disposed on a substrate support 103. A Group III element nitride seed crystal (not shown) is disposed on the substrate 202. Specifically, for example, the state of disposing a Group III element nitride seed crystal on the substrate 202 may be the state of disposing a Group III element nitride seed crystal 11 on a substrate 10 in (a) in FIG. 1A The shape and the like of the Group III element nitride seed crystal are not limited to those in the state of (a) in FIG. 1A and may be any shapes and the like. For example, the Group III element nitride seed crystal may cover the entire upper surface of the substrate 202. The substrate 202 and the Group III element nitride seed crystal disposed thereon can be selected, as appropriate, according to the form of the Group III element nitride crystal to be generated thereon. The material of the substrate 202 is not limited to particular materials and as described for FIGS. 1A and 1B. For example, as substitute for the structure in which the Group III element nitride seed crystal is disposed on the substrate 202, the substrate 202 itself may be formed of a Group III element nitride crystal so that the substrate 202 may serve as the Group III element nitride seed crystal.

Figure 7:
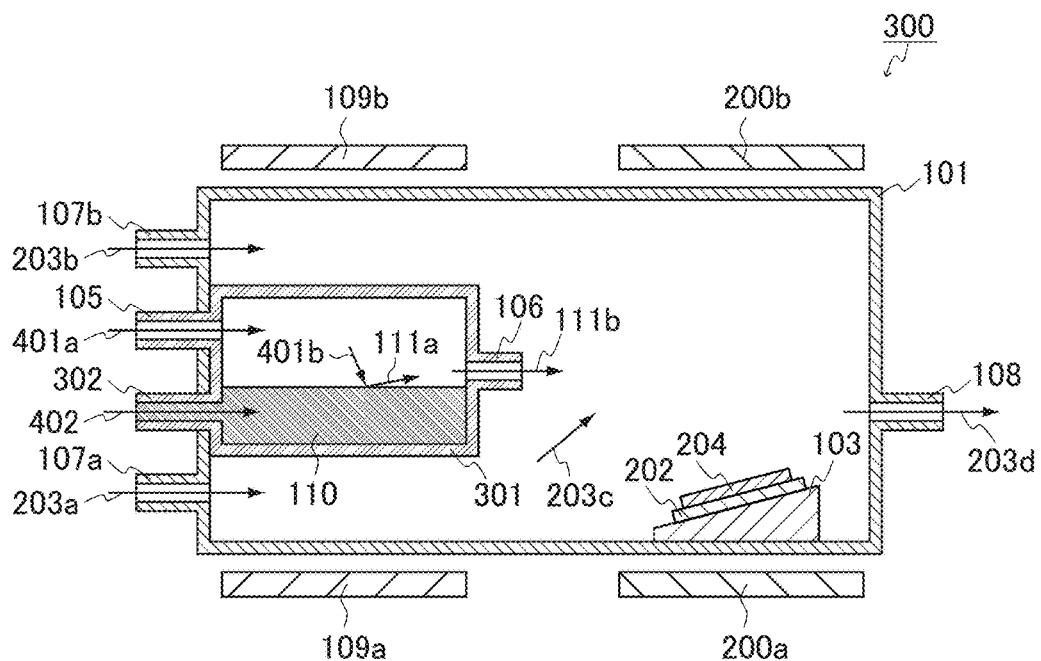
FIG. 7 is a cross-sectional view schematically illustrating an overview of the production method of the present invention using the device of FIG. 6.

As shown in FIG. 5, the Group III metal 110 is then disposed on the Group III metal placement portion 104. In the use of the production device of FIG. 6, a Group III metal 402 is introduced into the second container 301 through the Group III metal introduction tube 302 and is stored in the lower portion of the inside of the second container 301 as the Group III metal 110 as shown in FIG. 7. The Group III metal 402 can be continuously introduced into the second container 301 through the Group III metal introduction tube 302. For example, the Group III metal 402 can be introduced to refill the second container 301 with a quantity equivalent to the Group III metal 110 consumed by reaction, for example. The Group III metal is not limited to particular metals, examples thereof include aluminium (Al), gallium (Ga), indium (In), and thallium (Ti), and they may be used alone or in a combination of two or more of them. For example, as the Group III metal, at least one selected from the group consisting of aluminium (Al), gallium (Ga), and indium (In) may be used. In this case, the composition of the Group III element nitride crystal to be produced is represented by $Al_sGa_tIn_{\{1-(s+t)\}}N$ (provided that $0 \leq s \leq 1$, $0 \leq t \leq 1$, $s+t \leq 1$). The Group III metal 110 may be caused to react in the presence of a dopant material, for example. The dopant is not limited to particular dopants and can be, for example, germanium oxide (e.g., $Ge_2O_3$, $Ge_2O$).

A ternary or higher nitride crystal produced using two or more kinds of Group III metals can be, for example, a crystal represented by $Ga_xIn_{1-x}N$ ($0<x<1$). For generation of a ternary or higher nitride crystal, gases of the respective reduced products of at least two different kinds of Group III element oxides are preferably generated. In this case, a production device including at least two second containers is preferably used.

Group III metals have relatively low melting points and are thus easily liquefied by heat. The liquefied Group III metals can be continuously supplied into the reaction vessel (the inside of the second container 301 in FIG. 7) easily. In FIGS. 6 and 7, the Group III metal introduction tube 302 can be referred to as a "liquid raw material supply unit" in the Group III element nitride crystal production device of the present invention or a part thereof. Among the Group III metals, gallium (Ga) is particularly preferable. This is because gallium nitride (GaN) produced of gallium is very useful as a material for a semiconductor device, and gallium is liquefied even at room temperature because of its low melting point of about 30° C., and the gallium thus can be particularly easily supplied to a reaction vessel continuously. In the use of only gallium as the Group III metal, the Group III element nitride crystal to be produced is, as mentioned above, gallium nitride (GaN). In the use of the Group III element oxide as a raw material in the production method of the present invention (vapor phase growth step (B)), the Group III element oxide can be continuously supplied by the "liquid raw material supply unit" if the Group III element oxide can be liquefied (for example, by heat). In this case, the Group III metal introduction tube 302 can be used as a Group III element oxide introduction tube 302. The Group III element oxide introduction tube 302 may be referred to as a "Group III element oxide supply unit". The oxidizing gas introduction tube 105 may be used as a reducing gas introduction tube 105. The reducing gas introduction tube 105 can be referred to as a "reducing gas supply unit". The Group III metal oxidization product gas delivery tube 106 can be used as a reduced product gas delivery tube 106. The nitrogen-containing gas introduction tubes 107a and 107b each can be referred to as a "nitrogen-containing gas supply unit" as in the case of using a Group III metal. The method for performing the vapor phase growth step (B) using the production devices of FIGS. 4 and 5 are described below. The vapor phase growth step (B) using the production devices of FIGS. 6 and 7 can be performed, for example, in the same manner as in the method using the production devices of FIGS. 4 and 5 except that a liquid Group III element oxide is continuously supplied through the Group III element oxide introduction tube 302.

The Group III metal 110 is then heated using the first heating units 109a and 109b, and the Group III element nitride seed crystal disposed on the substrate 202 is heated using second heating units 200a and 200b. In this state, an oxidizing gas 201a (or 401a) is introduced through the oxidizing gas introduction tube 105, and nitrogen-containing gasses 203a and 203b are introduced through the nitrogen-containing gas introduction tubes 107a and 107b. The oxidizing gas 201a (or 401a) is not limited to particular gasses and is, as mentioned above, preferably at least one selected from the group consisting of $H_2O$ gas, $O_2$ gas, $CO_2$ gas, and CO gas, particularly preferably $H_2O$ gas. The oxidizing gas 201a (or 401a) introduced (supplied) into the second container 102 (or 301) is brought into contact with the surface of the Group III metal 110 (oxidizing gas 201b or 401b). The Group III metal 110 and the oxidizing gas 201b (or 401b) are caused to react with each other by the contact to generate a Group III metal oxidation product gas 111a (Group III metal oxidation product gas generation step). The flow rate of the oxidizing gas is not limited to particular rates and is, for example, in the range from 0.00001 to 500 Pa·m³/s, preferably from 0.0001 to 100 Pa·m³/s, more preferably from 0.0005 to 10 Pa·m³/s.

The Group III metal is caused to react with the oxidizing gas preferably under heating in the Group III metal oxidation product gas generation step of the production method of the present invention to accelerate the generation of the Group III metal oxidization product gas. In this case, the temperature of the Group III element oxide is not limited to particular temperatures and is preferably in the range from 650° C. to 1500° C., more preferably from 900° C. to 1400° C., yet more preferably from 1000° C. to 1300° C.

In the Group III metal oxidation product gas generation step, it is particularly preferred that the Group III metal is gallium, the oxidizing gas is an $H_2O$ gas, and the Group III metal oxidization product gas is $Ga_2O$. The reaction formula in this case can be represented by, for example, the following formula (I). The reaction formula, however, is by no means limited thereto.

$$2Ga + H_2O \rightarrow Ga_2O + H_2 \quad (I)$$

The Group III metal oxidation product gas generation step in the production method of the present invention may be performed under an atmosphere of a mixed gas of the oxidizing gas and an inactive gas to control the partial pressure of the oxidizing gas. The proportions of the oxidizing gas and the inactive gas in the total amount of the mixed gas is not limited to particular proportions. Preferably, the proportion of the oxidizing gas in the total amount of the mixed gas is 0.001 vol % or more to less than 100 vol %, and the proportion of the inactive gas in the same is more than 0 to 99999 vol % or less. More preferably, the proportion of the oxidizing gas in the total amount of the mixed gas is 0.01 vol % or more to 80 vol % or less, and the proportion of the inactive gas in the same is 20 vol % or more to 99.99 vol % or less. Yet more preferably, the proportion of the oxidizing gas in the total amount of the mixed gas is 0.1 vol % or more to 60 vol % or less, and the proportion of the inactive gas in the same is 40 vol % or more to 99.9 vol % or less. Examples of the inactive gas used in the production method of the present invention include nitrogen gas, helium gas, argon gas, and krypton gas. Among them, nitrogen gas is particularly preferable. Examples of a method for creating the atmosphere of the mixed gas include a method in which the second container is provided with an inactive gas introduction tube (not shown) separately from the oxidizing gas introduction tube to introduce an inactive gas and a method in which the mixed gas is previously produced by mixing hydrogen gas and an inactive gas at a predetermined ratio and is then introduced through the oxidizing gas introduction tube. When the second container is provided with an inactive gas introduction tube to introduce an inactive gas, the flow rate of the inactive gas can be set, as appropriate, according to, for example, the flow rate of the oxidizing gas. The flow rate of the inactive gas is, for example, in the range from 0.01 to 1500 Pa·m³/s, preferably from 0.02 to 300 Pa·m³/s, more preferably from 0.03 to 100 Pa·m³/s.

The generated Group III metal oxidation product gas 111a is delivered to the outside of the second container 102 (or 301) through the Group III metal oxidation product gas delivery tube 106 (Group III metal oxidation product gas 111b). The Group III metal oxidation product gas 111b is Ga$_2$O in FIG. 7 and, however, is by no means limited thereto. A first carrier gas may be introduced to deliver the Group III metal oxidation product gas 111b to the outside of the second container 102 (301) through the Group III metal oxidation product gas delivery tube 106. The first carrier gas may be the same as the inactive gas, for example. The flow rate (partial pressure) of the first carrier gas may be the same as that of the inactive gas. For the introduction of the inactive gas, the inactive gas may be used as the first carrier gas.

The Group III metal oxidation product gas 111a (111b) may be generated, for example, under pressure or reduced pressure or without pressurization and depressurization. The pressure in the pressurization is not limited to particular pressures and is preferably in the range from 1.0×10$^5$ to 1.50×10$^7$ Pa, more preferably from 1.05×10$^5$ to 5.00×10$^6$ Pa, yet more preferably from 1.10×10$^5$ to 9.90×10$^5$ Pa. The pressurization is not limited to particular methods and can be, for example, a method in which the pressure is adjusted with the oxidizing gas, the first carrier gas, or the like. The pressure in the depressurization is not limited to particular pressures and is preferably in the range from 1×10$^1$ to 1×10$^5$ Pa, more preferably from 1×10$^2$ to 9×10$^4$ Pa, yet more preferably from 5×10$^3$ to 7×10$^4$ Pa.

The Group III metal oxide gas (e.g., a Ga$_2$O gas) 111b delivered to the outside of the second container 102 (or 301) through the Group III metal oxidization product gas delivery tube 106 reacts with the nitrogen-containing gas 203c introduced into the first container 101, and a Group III nitride (e.g., GaN) crystal 204 is thus generated on the Group III element nitride seed crystal disposed on the substrate 202 (Group III element nitride crystal generation step). The reaction formula in this case can be represented by, for example, the following formula (III) assuming that the Group III metal oxidization product gas is Ga$_2$O gas, and the nitrogen-containing gas is an ammonia gas and, however, is by no means limited thereto. An excess remaining gas after the reaction can be exhausted as an exhaust gas 203d through an exhaust tube 108.

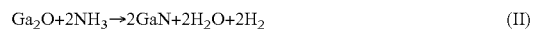

$$Ga_2O+2NH_3 \rightarrow 2GaN+2H_2O+2H_2 \qquad (II)$$

In the production method of the present invention, examples of the nitrogen-containing gas include nitrogen gas (N$_2$), ammonia gas (NH$_3$), hydrazine gas (NH$_2$NH$_2$), and alkylamine gas (e.g., C$_2$H$_8$NH$_3$). The nitrogen-containing gas is particularly preferably NH$_3$.

In the Group III element nitride crystal generation step, the temperature of the substrate is not limited to particular temperatures and is preferably 1200° C. or more, more preferably 1300° C. or more, yet more preferably 1400° C. or more, particularly preferably 1500° C. or more to maintain the crystal generation rate and improve crystalline properties. The upper limit of the temperature of the substrate is not limited to particular temperatures and is, for example, 2000° C. or less.

The Group III element nitride crystal generation step may be performed under pressure or reduced pressure or without pressurization and depressurization. The pressure in the pressurization is not limited to particular pressures and is preferably in the range from 1.01×10$^5$ to 1.50×10$^7$ Pa, more preferably from 1.05×10$^5$ to 5.00×10$^6$ Pa, yet more preferably from 1.10×10$^5$ to 9.90×10$^5$ Pa. The pressure in the depressurization is not limited to particular pressures and is preferably in the range from 1×10$^1$ to 1×10$^5$ Pa, more preferably 1×10$^2$ to 9×10$^4$ Pa, yet more preferably from 5×10$^3$ to 7×10$^4$ Pa.

In the Group III element nitride crystal generation step, the amount of the Group III metal oxidization product gas (e.g., Ga$_2$O gas, indicated by 111b in FIGS. 5 and 7) to be supplied is, for example, in the range from 5×10$^{-5}$ to 5×10$^1$ mol/h, preferably from 1×10$^{-4}$ to 1×10$^1$ mol/h, more preferably from 2×10$^{-4}$ to 2 mol/h. The amount of the Group III metal oxidization product gas to be supplied can be adjusted by, for example, adjusting the flow rate of the first carrier gas in generation of the Group III metal oxidization product gas.

The flow rate of the nitrogen-containing gas can be set, as appropriate, according to the conditions such as the temperature of the substrate. The flow rate of the nitrogen-containing gas is, for example, from 0.01 to 1500 Pa·m³/s, preferably from 0.03 to 600 Pa·m³/s, more preferably from 0.05 to 300 Pa·m³/s.

A second carrier gas may be introduced to transfer the introduced nitrogen-containing gas to a crystal generation region (to the vicinity of the substrate support 103 in the first container 101 in FIGS. 4 to 7). The carrier gas may be introduced through a carrier gas introduction tube (not shown) provided separately from the nitrogen-containing gas introduction tube or may be introduced through the nitrogen-containing gas introduction tube after mixing with the nitrogen-containing gas. The same gas as the first carrier gas can be used as the second carrier gas, for example.

When the carrier gas introduction tube is provided to introduce the second carrier gas, the flow rate of the second carrier gas can be set, as appropriate, according to the flow rate of the nitrogen-containing gas, for example. The flow rate of the second carrier gas is, for example, in the range from 0.01 to 1500 Pa·m$^3$/s, preferably from 0.08 to 600 P·am$^3$/s, more preferably from 0.15 to 300 Pa·m$^3$/s.

The mixing ratio A:B (volume ratio) between the nitrogen-containing gas (A) and the second carrier gas (B) is not limited to particular ratios and is preferably in the range from 2:98 to 80:20, more preferably from 5:95 to 60:40, yet more preferably from 10:90 to 40:60. The mixing ratio A:B (volume ratio) can be set by, for example, a method in which the mixed gas is previously produced at a predetermined mixing ratio or a method in which the flow rates (partial pressures) of the nitrogen-containing gas and the second carrier gas are adjusted.

The Group III element nitride crystal (e.g., GaN crystal) generation step can be performed preferably under pressure. The pressure in the pressurization is as mentioned above. The pressurization can be, for example, pressurization with the nitrogen-containing gas, the second carrier gas, or the like.

The Group III element nitride crystal generation step may be performed in an atmosphere of a dopant-containing gas. In such atmosphere, a dopant-containing GaN crystal can be generated. Examples of the dopant include Si, S, Se, Te, Ge, Fe, Mg, and Zn. The dopants may be used alone or in a combination of two or more of them. Examples of the dopant-containing gas include monosilane (SiH$_4$), disilane (Si$_2$H$_6$), triethylsilane (SiH(C$_2$H$_5$)$_3$), tetraethylsilane (Si(C$_2$H$_5$)$_4$), H$_2$S, H$_2$Se, H$_2$Te, GeH$_4$, Ge$_2$O, SiO, MgO, and ZnO, and they may be used alone or in a combination of two or more of them.

For example, the dopant-containing gas may be introduced through a dopant-containing gas introduction tube (not shown) provided separately from the nitrogen-containing gas introduction tube or may be introduced through the nitrogen-containing gas introduction tube after mixing with the nitrogen-containing gas. For the introduction of the second carrier gas, the dopant-containing gas may be introduced after mixing with the second carrier gas.

The concentration of the dopant in the dopant-containing gas is not limited to particular concentrations and is, for example, in the range from 0.001 to 100000 ppm, preferably from 0.01 to 1000 ppm, more preferably from 0.1 to 10 ppm.

The generation rate of the Group III element nitride crystal (e.g., GaN crystal) is not limited to particular rates and is, for example, 100 μm/h or more, preferably 500 μm/h or more, and more preferably 1000 μm/h or more.

The vapor phase growth step (A) can be performed as described above and, however, is by no means limited thereto. For example, as mentioned above, the reaction is performed preferably in the presence of a reducing gas in a reaction system in the Group III element nitride crystal production step (A). As mentioned above, the reaction is performed more preferably through mixing the reducing gas with at least one of the oxidizing gas or the nitrogen-containing gas. That is, in FIG. 5 or 7, the reducing gas may be mixed with at least one of the nitrogen-containing gases 203a and 203b and the oxidizing gas 201a (or 401a). In the production method of the present invention, the reducing gas is yet more preferably mixed with the oxidizing gas. This allows, for example, generation of byproducts caused by the reaction between the Group III metal and the oxidizing gas to be prevented and reaction efficiency (reaction efficiency of the Group III metal oxidization product gas) to be further increased in the Group III metal oxidization product gas generation step. Specifically, for example, H$_2$ gas (the reducing gas) is mixed with H$_2$O gas (the oxidizing gas) in a reaction between gallium (the Group III metal) and the H$_2$O gas, thereby preventing the generation of Ga$_2$O$_3$ as a byproduct and further increasing the generation efficiency of a Ga$_2$O gas (the Group III metal oxidization product gas).

Examples of the reducing gas for use in the vapor phase growth step (A) include hydrogen gas, carbon monoxide gas, a hydrocarbon gas such as methane gas or ethane gas, hydrogen sulfide gas, and sulfur dioxide, and they may be used alone or in a combination of two or more of them. Among them, hydrogen gas is particularly preferable. The higher the purity of the hydrogen gas is, the better. The purity of the hydrogen gas is particularly preferably 99.9999% or more.

The reaction temperature in the Group III metal oxidization product gas generation step performed in the presence of a reducing gas is not limited to particular temperatures and is preferably 900° C. or more, more preferably 1000° C. or more, yet more preferably 1100° C. or more to prevent the generation of byproduct. The upper limit of the reaction temperature is not limited to particular temperatures and is, for example, 1500° C. or less.

The amount of the reducing gas to be used in the vapor phase growth step (A) is not limited to particular amounts, and the proportion of the reducing gas in the total volume of the oxidizing gas and the reducing gas is, for example, from 1 to 99 vol %, preferably from 3 to 80 vol %, more preferably from 5 to 70 vol %. The flow rate of the reducing gas can be set, as appropriate, according to, for example, the flow rate of the oxidizing gas. The flow rate of the reducing gas is not limited to particular rates and is, for example, in the range from 0.001 to 1000 Pa·m$^3$/s, preferably from 0.005 to 500 Pa·m$^3$/s, more preferably from 0.01 to 100 Pa·m$^3$/s. The Group III metal oxidization product gas 111a (111b) is generated preferably under pressure as mentioned above, and the pressure is, for example, as mentioned above. The pressurization may be, for example, pressurization with the oxidizing gas or the reducing gas.

The vapor phase growth step (A) in the present invention is vapor deposition and however can be performed without using a halide as a raw material. Without using a halide, a Group III element nitride crystal can be produced without producing a byproduct containing halogen in contrast to the halide vapor phase epitaxy described in JP S52-23600 A (Patent Document 1) or the like. Accordingly, for example, the influences of clogging of an exhaust tube of the production device with the byproduct containing halogen (e.g., NH$_4$Cl) and the like on the generation of the crystal can be prevented.

(1-2-3. Production Steps, Reaction Conditions, and the Like in Vapor Phase Growth Step (B))

The following describes production steps, reaction conditions, and the like in the vapor phase growth step (B) with reference to examples.

The vapor phase growth step (B) can be performed using the production device 100 shown in FIG. 4. Specifically, a Group III metal placement portion 104 is used as a Group III element oxide placement portion 104, the oxidizing gas introduction tube 105 is used as a reducing gas introduction tube 105, and the Group III metal oxidization product gas delivery tube 106 is used as a reduced product gas delivery tube 106.

The following describes the vapor phase growth step (B) in detail with reference to FIG. 5 using an example where the production device shown in FIG. 4 is used, Ga$_2$O$_3$ is used as the Group III element oxide, the gas of the reduced product is Ga$_2$O gas, hydrogen gas is used as the reducing gas, ammonia gas is used as the nitrogen-containing gas, and a Group III element nitride crystal to be generated is a GaN crystal. The vapor phase growth step (B), however, is by no means limited thereto. As mentioned above, the vapor phase growth step (B) includes a reduced product gas generation step and a crystal generation step.

$Ga_2O_3$ is disposed in the Group III element oxide placement portion 104, and a substrate 202 is disposed on a substrate support 103. A Group III element nitride seed crystal (not shown) is disposed on the substrate 202 as in the vapor phase growth step (A). Alternatively, for example, the substrate 202 may be formed of and may serve as a Group III element nitride crystal. The $Ga_2O_3$ is then heated using first heating units 109a and 109b, and the substrate 202 is heated using second heating units 200a and 200b. In this state, a hydrogen gas 201a is introduced through a reducing gas introduction tube 105, and ammonia gases 203a and 203b are introduced through nitrogen-containing gas introduction tubes 107a and 107b. The introduced hydrogen gas 201b reacts with the $Ga_2O_3$ to generate a $Ga_2O_3$ gas (following formula (III)). The generated $Ga_2O$ gas 111a is delivered to the outside of the second container 102 through the reduced product gas delivery tube 106 as a $Ga_2O$ gas 111b. The delivered $Ga_2O$ gas 111b reacts with the introduced ammonia gas 203c. A GaN crystal 204 is thus generated on the Group III element nitride seed crystal disposed on the substrate 202 (the following formula (IV)).

$$Ga_2O_3 + 2H_2 \rightarrow Ga_2O + 2H_2O \quad (III)$$

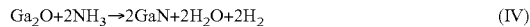

$$Ga_2O + 2NH_3 \rightarrow 2GaN + 2H_2O + 2H_2 \quad (IV)$$

As can be seen from the formulae (III) and (IV), only water and hydrogen are generated as byproducts in the vapor phase growth step (B). That is, no solid byproduct is generated. The water and the hydrogen can be discharged, for example, from an exhaust tube 108 as gas or liquid. The GaN crystal thus can be generated for a long period of time, for example, and a large, thick GaN crystal can be obtained. Moreover, for example, the vapor phase growth step (B) is advantageous in terms of cost because a filter for removing byproducts is not required. The vapor phase growth step (B), however, is by no means limited thereto.

The $Ga_2O_3$ is preferably in the powder form. The surface area of the $Ga_2O_3$ in the powder form is large, thereby accelerating the generation of the $Ga_2O$ gas.

For generation of a ternary or higher nitride crystal, gases of the respective reduced products of at least two different kinds of Group III element oxides are preferably generated. In this case, a production device including at least two second containers is preferably used.

The higher the purity of the hydrogen gas is, the better. The purity of the hydrogen gas is preferably 99.9999% or more. The flow rate (partial pressure) of the hydrogen gas can be set, as appropriate, according to, for example, the temperature of the $Ga_2O_3$. The partial pressure of the hydrogen gas is not limited to particular pressures and is, for example, in the range from 0.2 to 2000 kPa, preferably from 0.5 to 1000 kPa, more preferably from 1.5 to 500 kPa.

As mentioned above, the $Ga_2O$ gas is generated preferably in an atmosphere of a mixed gas of the hydrogen gas and an inactive gas to control the partial pressure of the hydrogen gas. The atmosphere of the mixed gas can be created by, for example, a method in which the second container is provided with an inactive gas introduction tube (not shown) separately from the reducing gas introduction tube to introduce an inactive gas or a method in which a mixed gas is previously produced by mixing hydrogen gas and an inactive gas at a predetermined ratio and is then introduced through the reducing gas introduction tube. When the second container is provided with an inactive gas introduction tube to introduce an inactive gas, the flow rate of the inactive gas can be set, as appropriate, according to, for example, the flow rate of the hydrogen gas. The partial pressure of the inactive gas is not limited to particular pressures and is, for example, in the range from 0.2 to 2000 kPa, preferably from 2.0 to 1000 kPa, more preferably from 5.0 to 500 kPa.

The proportions of the hydrogen gas and the inactive gas in the mixed gas are as mentioned above and can be set by, for example, a method in which the mixed gas is produced previously at a predetermined ratio or a method in which the flow rates (partial pressures) of the hydrogen gas and the inactive gas are adjusted.

A first carrier gas may be introduced to deliver the $Ga_2O$ gas to the outside of the second container through the reduced product gas delivery tube. The first carrier gas to be used may be the same as the inactive gas, for example. The flow rate (partial pressure) of the first carrier gas may be the same as that of the inactive gas. The inactive gas may be used as the first carrier gas to introduce the inactive gas.

The pressure under which the $Ga_2O$ gas is generated is not limited to particular pressures and is preferably in the range from $1.0 \times 10^5$ to $1.50 \times 10^7$ Pa, more preferably, from $1.05 \times 10^5$ to $5.00 \times 10^6$ Pa, yet more preferably from $1.10 \times 10^5$ to $9.90 \times 10^5$ Pa. The pressurization is not limited to particular methods and can be, for example, a method in which the pressure is adjusted with the hydrogen gas, the first carrier gas, or the like.

As mentioned above, when gasses of the respective reduced products of at least two different kinds of Group III element oxides are generated, a ternary or higher nitride crystal is, generated on the substrate, for example. The ternary or higher nitride crystal can be, for example, $Ga_xIn_{1-x}N$ (0<x<1).

The amount of the $Ga_2O$ gas to be supplied is, for example, in the range from $5 \times 10^{-5}$ to $5 \times 10^1$ mol/h, preferably, from $1 \times 10^{-4}$ to $1 \times 10^1$ mol/h, more preferably from $2 \times 10^{-4}$ to 2 mol/h. The amount of the $Ga_2O$ gas to be supplied can be adjusted by, for example, adjusting the flow rate (partial pressure) of the first carrier gas in generation of the $Ga_2O$ gas.

The flow rate (partial pressure) of the ammonia gas can be set, as appropriate, according to conditions such as the temperature of the substrate. The partial pressure of the ammonia gas is not limited to particular pressures and is, for example, in the range from 0.2 to 3000 kPa, preferably from 0.5 to 2000 kPa, more preferably from 1.5 to 500 kPa.

A second carrier gas may be introduced to transfer the introduced ammonia gas to a crystal generation region. The second carrier gas may be introduced through a carrier gas introduction tube (not shown) provided separately from the nitrogen-containing gas introduction tube or may be introduced through the nitrogen-containing gas introduction tube after mixing with the ammonia gas. The same gas as the first carrier gas can be used as the second carrier gas, for example.

When a carrier gas introduction tub e is provided to introduce the second carrier gas, the flow rate (partial pressure) of the second carrier gas can be set, as appropriate, according to the flow rate (partial pressure) of the nitrogen-containing gas. The flow rate of the second carrier gas is not limited to particular pressures and is, for example, in the range from 0.2 to 3000 Pa·m³/s, preferably from 0.5 to 2000 P·am³/s, more preferably from 1.5 to 1000 Pa·m³/s.

The mixing ratio A:B (volume ratio) between the ammonia gas (A) and the second carrier gas (B) is not limited to particular ratios and is preferably in the range from 3:97 to 80:20, more preferably from 8:92 to 60:40, yet more preferably from 10:90 to 40:60. The mixing ratio A:B (volume ratio) can be set by, for example, a method in which the mixed gas is previously produced at a predetermined mixing ratio or a method in which the flow rates (partial pressures) of the ammonia gas and the second carrier gas are adjusted.

The GaN crystal is generated preferably under pressure. The pressure in the pressurization is as mentioned above. The pressurization can be, for example, pressurization with the ammonia gas, the second carrier gas, or the like.

The GaN crystal may be generated in an atmosphere of a dopant-containing gas. In such atmosphere, a dopant-containing GaN crystal can be generated. Examples of the dopant include Si, S, Se, Te, Ge, Fe, Mg, and Zn. The dopants may be used alone or in a combination of two or more of them. Examples of the dopant-containing gas include monosilane ($SiH_4$), disilane ($Si_2H_6$), triethylsilane ($SiH(C_2H_5)_3$), tetraethylsilane ($Si(C_2H_5)_4$), $H_2S$, $H_2Se$, $H_2Te$, $GeH_4$, $Ge_2O$, SiO, MgO, and ZnO, and they may be used alone or in a combination of two or more of them.

For example, the dopant-containing gas may be introduced through a dopant-containing gas introduction tube (not shown) provided separately from the nitrogen-containing gas introduction tube or may be introduced through the nitrogen-containing gas introduction tube after mixing with the ammonia gas. For the introduction of the second carrier gas, the dopant-containing gas may be introduced after mixing with the second carrier gas.

The concentration of the dopant in the dopant-containing gas is not limited to particular concentrations and is, for example, in the range from 0.001 to 100000 ppm, preferably from 0.01 to 1000 ppm, more preferably from 0.1 to 10 ppm.

The generation rate of the GaN crystal is not limited to particular rates and is not limited to particular rates and is, for example, 100 μm/h or more, preferably 500 μm/h or more, and more preferably 1000 μm/h or more.

The production method of the present invention can generate a Group III element nitride crystal using a Group III element oxide other than $Ga_2O_3$ as in the case of generating a GaN crystal using $Ga_2O_3$.

The Group III element oxide other than $Ga_2O_3$ can be, for example, $In_2O_3$ for In as the Group III element, $Al_2O_3$ for Al as the same, $B_2O_3$ for B as the same, and $Tl_2O_3$ for Tl as the same. The Group III element oxides other than $Ga_2O_3$ may be used alone or in a combination of two or more of them.

(1-2-4. Group III Element Nitride Crystal Produced by Vapor Phase Growth Step (A) or (B))

The size of the Group III element nitride crystal to be produced by the vapor phase growth step is not limited to particular sizes, and the major axis is preferably 15 cm (about 6 inches) or more, more preferably 20 cm (about 8 inches) or more, particularly preferably 25 cm (about 10 inches) or more. The height of the Group III element nitride crystal is not limited to particular heights and may be, for example 1 cm or more, preferably 5 cm or more, more preferably 10 cm or more. The production method of the present invention, however, is not limited by the production of such large Group III element nitride crystal and can be used to produce a higher-quality Group III element nitride crystal in a conventional size, for example. Moreover, for example, the height (thickness) of the Group III element nitride crystal is not limited to particular thicknesses as mentioned above and may be, for example, less than 1600 μm.

In the Group III element nitride crystal, the dislocation density is not limited to particular densities and is preferably $1.0 \times 10^7$ $cm^{-2}$ or less, more preferably $1.0 \times 10^5$ $cm^{-2}$ or less, yet more preferably $1.0 \times 10^4$ $cm^{-2}$ or less, yet more preferably $1.0 \times 10^3$ $cm^{-2}$ or less, yet more preferably $1.0 \times 10^2$ $cm^{-2}$ or less. The dislocation density is ideally 0. However, it is generally impossible for the dislocation density to be 0. The dislocation density is thus, for example, more than 0 and is particularly preferably a measurement limit or less of a measurement device. The dislocation density may be expressed as, for example, an average of the dislocation densities of the entire crystal, and more preferably, the maximum value in the crystal is the above-described values or less. In the Group III element nitride crystal of the present invention, the half width of each of a symmetric reflection component (002) and an asymmetric reflection component (102) by XRC is, for example, 300 seconds or less, preferably 100 seconds or less, more preferably 30 seconds or less, ideally 0.

The production method of the present invention may further include a crystal re-growth step of further growing the produced Group III element nitride crystal. Specifically, for example, in the crystal re-growth step, the produced Group III element nitride crystal is cut so that any plane (e.g., c-, m-, or a-plane or another nonpolar plane) is exposed, and the Group III element nitride crystal is further grown using the plane as a crystal growth plane. A Group III element nitride crystal with a large area of any plane and a large thickness can be produced thereby.

(2. Group III Element Nitride Crystal and Semiconductor Device)

The Group III element nitride crystal of the present invention is a Group III element nitride crystal produced by the production method of the present invention or a Group III element nitride crystal produced by further growing the Group III element nitride crystal. The Group III element nitride crystal of the present invention is, for example, a high-quality, large Group III element nitride crystal with few defects. Although the quality is not particularly limited, the dislocation density is, for example, preferably in the numerical range described in the section "1. Method for producing Group III element nitride crystal". The size of the Group III element nitride crystal also is not limited to particular sizes and is, for example, as mentioned above. The use of the Group III element nitride crystal of the present invention also is not particularly limited and can be used in a semiconductor device because of having properties of a semiconductor, for example.

The present invention can provide, as mentioned above, a Group III nitride (e.g., GaN) crystal with a diameter of 6 inches or more, which has not been produced by a conventional technique. Accordingly, for example, by using Group III nitride as a substitute for Si in a semiconductor device such as a power device generally required to have a large diameter of Si (silicon), a high-frequency device, or the like, the performance can be further improved. Therefore, the present invention exerts a great impact on the semiconductor industry. The Group III element nitride crystal of the present invention, however, is by no means limited thereby and is applicable to any other semiconductor devices such as solar batteries and other applications besides the semiconductor devices.

The semiconductor device of the present invention is not limited to particular devices and may be any article operated using a semiconductor. Examples of the article operated using a semiconductor include a semiconductor device and electrical equipment using the semiconductor device.

Examples of the semiconductor device include: high-frequency devices and power devices such as diodes and transistors; and a light-emitting devices such as light-emitting diodes (LEDs) and laser diodes (LDs). Examples of the electrical equipment using the semiconductor device include a base station for high-frequency device-equipped mobile phone, control equipment for power device-equipped solar cell, power supply control equipment for vehicle driven using electricity, a light-emitting device-equipped display, a light-emitting device-equipped lighting, and an optical disc device. For example, a laser diode (LD) that emits blue light is applied to high-density optical discs and displays, and a light-emitting diode (LED) that emits blue light is applied to displays and lighting. Moreover, an ultraviolet LD is expected to be applied to biotechnology, and an ultraviolet LED is expected to be an ultraviolet source as a substitute for a mercury lamp. Moreover, an inverter using a Group III-V compound as a power semiconductor for inverter can be used for, for example, electric power generation such as a solar cell. Furthermore, as mentioned above, the Group III element nitride crystal of the present invention, however, is by no means limited thereto and is applicable to any other semiconductor devices and a wide of other technical fields.

EXAMPLES

The following describes examples of the present invention. The present invention, however, is by no means limited thereto.

In the present examples, GaN crystals were produced by vapor deposition as described below. The cross sections of the Group III element nitride crystals were subjected to a Scanning Electron Microscope (SEM) observation using a scanning electron microscope (produced by KEYENCE CORPORATION, trade name: "VHX-D500"). Each half width was measured by XRC using Smartlab (trade name) produced by RIGAKU.

Example 1

In the present example, a GaN crystal was grown on each of the +c-plane and the −c-plane, and results were compared on the basis of whether the diameters were increasing with growing of the crystal.

As a seed crystal for use in the vapor phase growth step, a 2-inch free-standing substrate produced by FKK Corporation was used. This free-standing substrate is formed of a GaN crystal produced by HYPE (vapor deposition) and also serves as a GaN seed crystal.

A GaN crystal was grown, by vapor deposition, on the crystal growth plane (the +c-plane or the −c-plane) of the seed crystal produced by liquid deposition, using a device having the configuration of FIG. 4 to produce an intended GaN crystal. The GaN crystal produced using a +c-plane as a crystal growth plane is of Comparative Example 1, and the GaN crystal produced using a −c-plane as a crystal growth plane is of Example 1. As a second container 102, a quartz container was used. The inner diameter of each of an oxidizing gas introduction tube 105 and nitrogen-containing gas introduction tubes 107a and 107b was 4 mm.

The vapor deposition (vapor phase growth step) was performed as follows. That is, in the present example, a large excess amount of gallium(III) oxide ($Ga_2O_3$) powder (purity: 99.9%) was used as a Group III element-containing raw material 110. A hydrogen gas ($H_2$) was used as a gas 201a of a reduced product. The partial pressure of the hydrogen gas ($H_2$) was set to be 3.3 kPa. The hydrogen gas 201a (201b) reacted with the gallium(III) oxide 110 to generate a gallium(I) oxide ($Ga_2O$) gas 111a (111b). In the present example, the partial pressure of the gallium(I) oxide gas 111a (111b) was assumed to be 4.3 kPa. The assumption was made as follows. That is, in the present example, the weight of $Ga_2O_3$ after the vapor deposition (vapor phase growth step) was subtracted from that before the vapor deposition (vapor phase growth step) to calculate a reduced weight of $Ga_2O_3$. The conversion efficiency from $Ga_2O_3$ to $Ga_2O$ (gallium(I) oxide) was then assumed to be 100% (i.e., it was assumed that 100% of the reduced weight of $Ga_2O_3$ was converted into $Ga_2O$), and the partial pressure of the gallium (I) oxide 111a (111b) was calculated as 4.3 kPa as described above.

As nitrogen-containing gases 203a and 203b, ammonia gas ($NH_3$) was used. The partial pressure of the ammonia gas was set to be 10 kPa. $NH_3$ gas (100% $NH_3$ gas containing no other gases) was introduced as a carrier gas through the oxidizing gas introduction tube 105 and the nitrogen-containing gas introduction tubes 107a and 107b, and pressurization was performed so that the total pressure became 100 kPa. The temperature of the Group III element-containing raw material ($Ga_2O_3$) 110 was set to be 900° C. The temperature (crystal growth temperature) of the GaN crystal layer substrate (202 in FIG. 5) was set to be 1200° C., and the crystal growth time (time in which each gas is caused to flow) was set to 1 h. By this vapor deposition, a GaN crystal having a thickness (homoepitaxial thickness) of 11 μm was produced on the GaN seed crystal (free-standing substrate).

Figure 8:
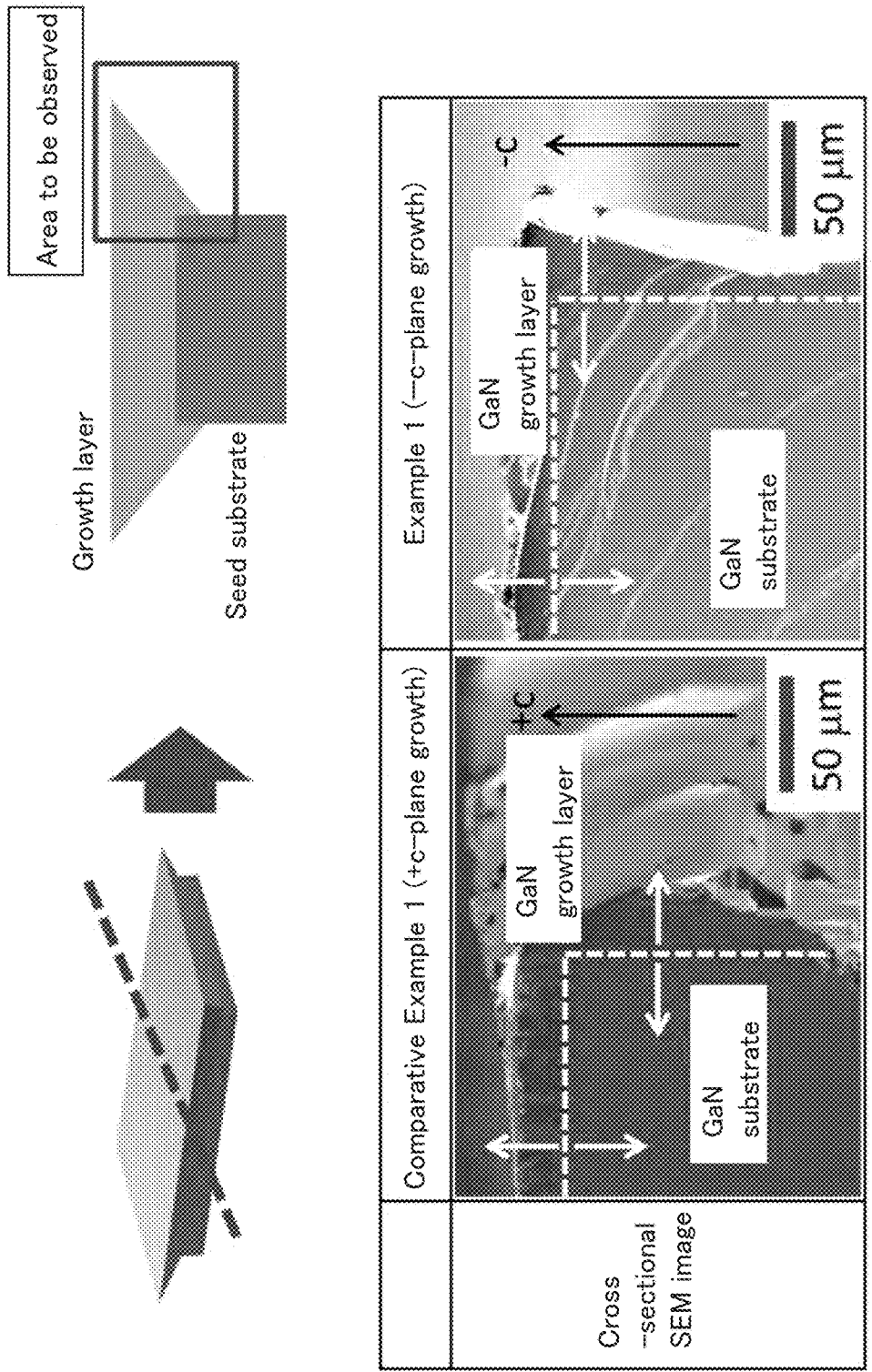
FIG. 8 shows photographs of the respective cross-sectional SEM images of GaN crystals of Comparative Example 1 and Example 1.

Images of the cross sections of outer peripheries at the upper ends of the respective produced GaN crystals were thereafter taken by SEM as shown in FIG. 8. If the diameter is increasing toward the top of the GaN crystal, the diameter is increasing with growing of the crystal. A left photograph in FIG. 8 is a cross-sectional SEM image of the GaN crystal (Comparative Example 1) produced using a +c-plane as a crystal growth plane. A right photograph in FIG. 8 is a cross-sectional SEM image of the GaN crystal (Example 1) produced using a −c-plane as a crystal growth plane. As shown in FIG. 8, an increase in diameter was not found in the GaN crystal of Comparative Example 1, whereas the increase in diameter was found in the GaN crystal of Example 1.

Example 2

Figure 9:
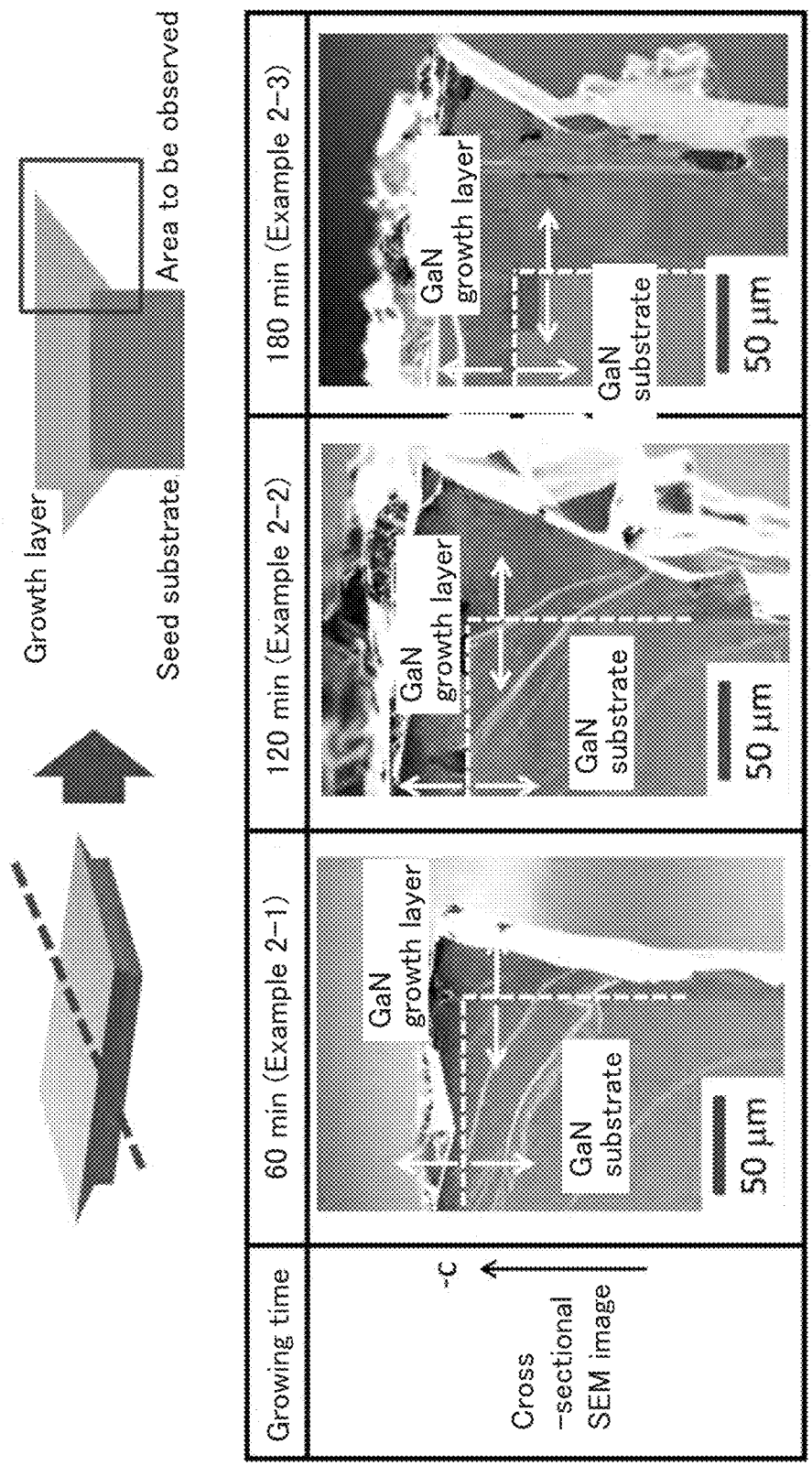
FIG. 9 shows photographs of cross-sectional SEM images of a GaN crystal in Example 2.
Figure 10:
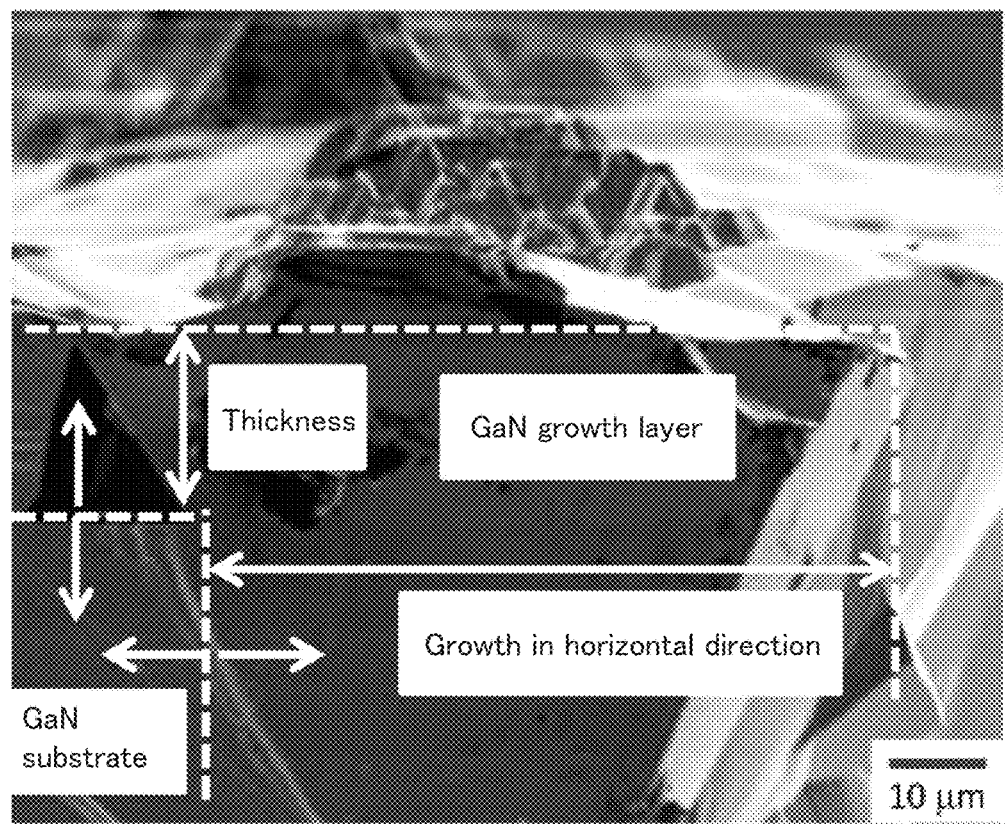
FIG. 10 is a photograph of a cross-sectional SEM image of the GaN crystal in Example 2.

In the present example, the GaN crystal was produced on a −c-plane to check for an increase in diameter of a GaN crystal growth for a long period of time (crystal growth). The GaN crystal was produced in the same manner as in Example 1 except that the conditions of the vapor phase growth step were as follows. The "temperature of growing portion" refers to the temperature of a GaN crystal layer substrate 202 and means the same as the crystal growth temperature. The "temperature of raw material portion" refers to the temperature of a Group III element-containing raw material ($Ga_2O_3$) 110. The "growing time" means the same as the crystal growth time (time in which each gas is caused to flow) described in Example 1. In the present example, each GaN crystal for the growing time of 60 minutes (Example 2-1), 120 minutes (Example 2-2), or 180 minutes (Example 2-3) was produced as follows. The "$NH_3$ line" shows flow rates of the nitrogen containing gasses 203a and 203b ($NH_3$ in the present example) and the carrier gas ($NH_3$ in the present example) caused to flow through the nitrogen-containing gas introduction tubes 107a and 107b. The "$Ga_2O$ line" shows flow rates of the gas 201a of the reduced product (H$_2$ in the present example) and the carrier gas (NH$_3$ in the present example) caused to flow through the oxidizing gas introduction tube 105. The "diameter Φ of raw material tube" shows the inner diameter of an oxidizing gas introduction tube 106. The same applies hereinafter.
Temperature of growing potion: 1200° C.
Temperature of raw material portion: 900° C.
Growing time: 60 minutes (Example 2-1), 120 minutes (Example 2-2), 180 minutes (Example 2-3)
NH$_3$ line: NH$_3$ 300 sccm+NH$_3$ 2200 sccm
Ga$_2$O line: H$_2$ 100 sccm+NH$_3$ 400 sccm
Diameter Φ of raw material tube: 6 mm Cross-sectional SEM images of the GaN crystals produced as described above were taken in the same manner as in Example 1 (FIG. 8). FIGS. 9 and 10 show the cross-sectional SEM images. As shown in FIGS. 9 and 10, a habit (crystal habit) of increasing a diameter was observed in the growth for a long period of time of the present example (Example 2) as in Example 1.

Figure 11:
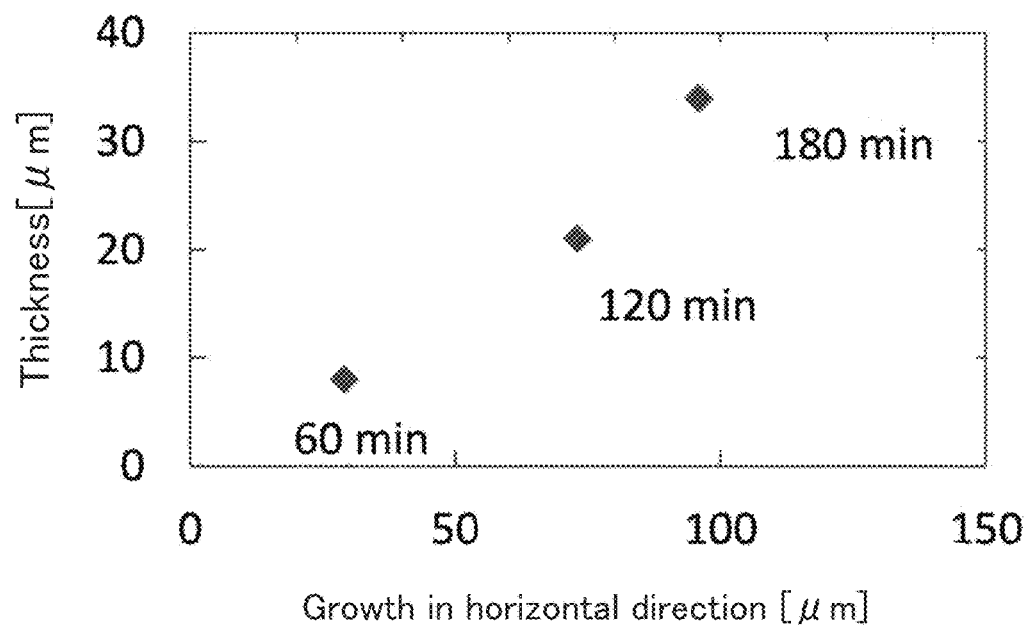
FIG. 11 is a graph showing a correlation between the thickness of the GaN crystal produced in Example 2 and the growth of the GaN crystal in the horizontal direction.

FIG. 11 is a graph showing a correlation between the thickness of the GaN crystal produced in the present example (Example 2) and the growth of the GaN crystal in the horizontal direction. In FIG. 11, the horizontal axis represents a dimensional increase [μm] of the produced GaN crystal in the horizontal direction, which represents the extent of the growth of the GaN crystal in the horizontal direction. That is, in the present example, images of the cross section of an outer periphery at the top of the produced GaN crystal were taken by SEM as shown in the drawing on the upper right side of FIG. 8 or 9, the horizontal axis of the graph of FIG. 11 represents a dimensional increase [μm] of an area of the GaN crystal to be observed (hereinafter also merely referred to as an area to be observed), and the vertical axis of the same represents the thickness [μm] of the GaN crystal. Note here that the thickness does not include the thickness of the GaN seed crystal (free-standing substrate). As shown in FIG. 11, the thickness was increasing, and the GaN crystal in the horizontal direction was growing further as an increase in growing time. That is, a positive correlation between the thickness and the growth in the horizontal direction was observed. This demonstrates that the diameter of the GaN crystal can be increased by the crystal growth for a long period of time.

[Plane Determination by Etching]

Figure 12:
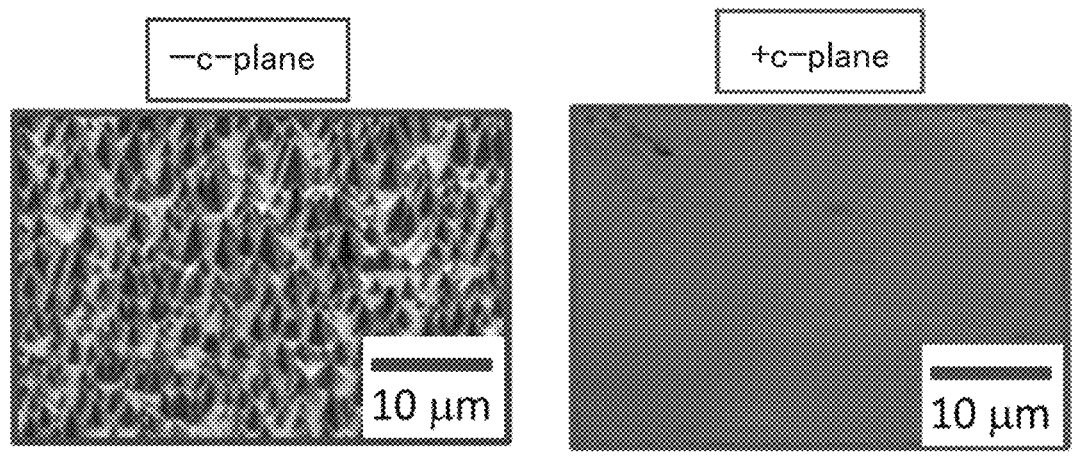
FIG. 12 shows the respective post-etching bird's-eye SEM images (microscope photographs) of a −c-plane and a +c-plane of a GaN crystal (produced by FKK) used as a seed crystal in the examples.

The crystal growth plane was determined (whether the crystal growth plane was a −c-plane or a +c-plane was determined) by etching to check the presence or absence of a polarity-inverted region in the crystal growth plane of the GaN crystal (after growth for 60 minutes) produced in Example 2. The conditions of the etching are as follows, and the upper surface (crystal growth plane) of the GaN crystal was etched.
Temperature: 80° C.
Etchant: 1 mol/L NaOH (aq.)
Etching time: 30 minutes FIG. 12 shows the respective post-etching bird's-eye SEM images (microscope photographs) of a −c-plane and a +c-plane of the GaN seed crystal (free-standing GaN substrate produced by FKK) for reference. The left photograph of FIG. 12 is a photograph of the −c-plane of the GaN seed crystal after the etching, and the right photograph of FIG. 12 is a photograph of the +c-plane of the GaN seed crystal after the etching. The conditions of the etching are as described above. As shown in FIG. 12, the −c-plane after the etching includes surfaces tilted with respect to the −c-plane, i.e., includes fine asperities. In contrast, the +c-plane after the etching was maintained to be flat. That is, in a GaN crystal grown by vapor deposition using a −c-plane as a crystal growth plane, when the crystal growth plane after the etching includes surfaces tilted with respect to the crystal growth plane, the crystal growth plane is determined as being maintained to be the −c-plane, and polar inversion (a change of the crystal growth plane from the −c-plane to the +c-plane) does not occur. In contrast, when the crystal growth plane is maintained to be flat without any surface tilted with respect to the crystal growth plane, it can be determined that polarity inversion occurs, and the crystal growth plane is changed to the +c-plane.

Figure 13:
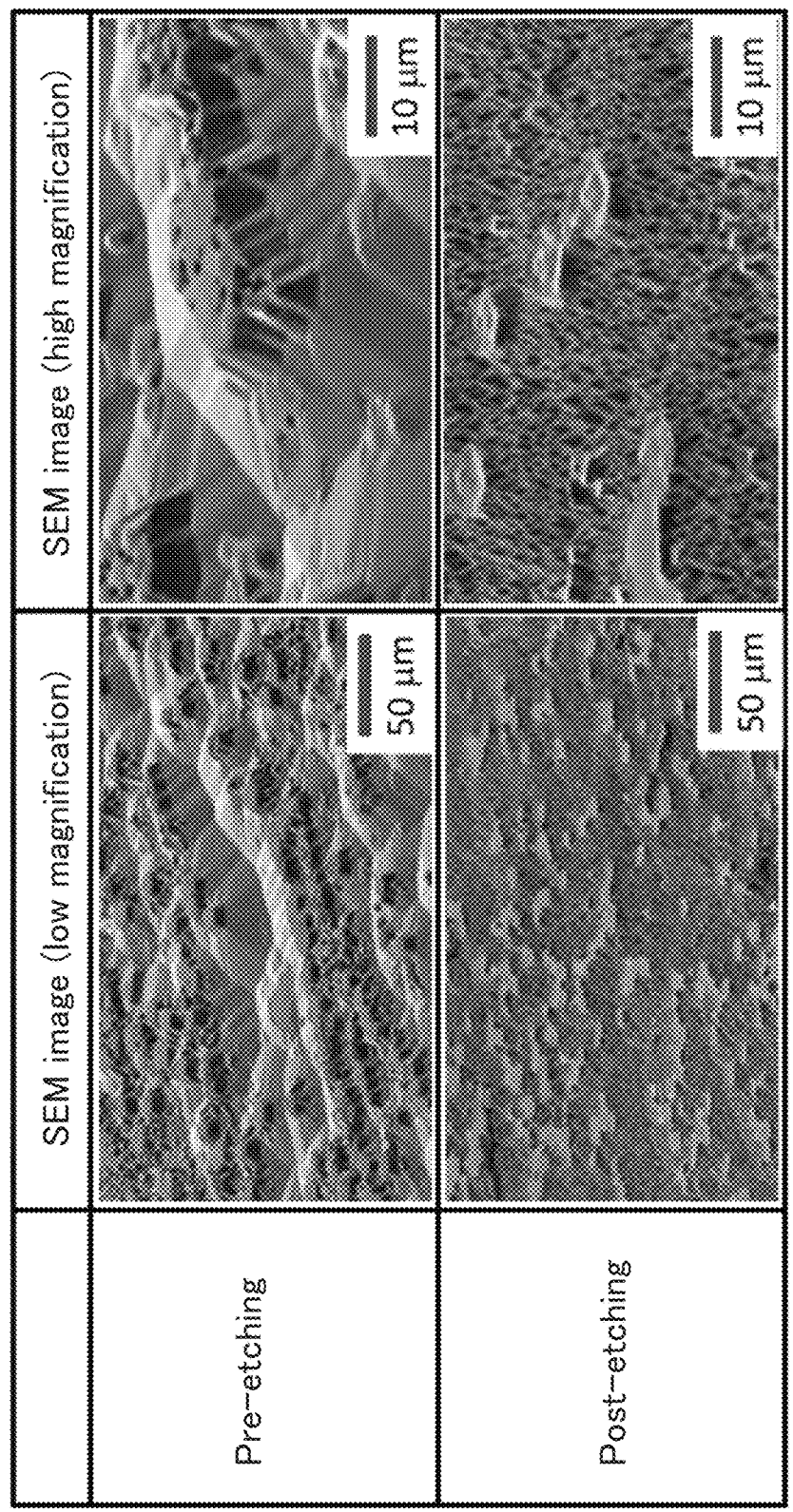
FIG. 13 shows pre-etching bird's-eye SEM images and post-etching bird's-eye SEM images of the GaN crystal (after the growth for 60 minutes) produced in Example 2.

FIG. 13 shows pre-etching and post-etching bird's-eye SEM images of the GaN crystal (after the growth for 60 minutes) produced in Example 2. As can be seen from the post-etching photographs (SEM images) in FIG. 13, small portions of the GaN crystal after the growth for 60 minutes are flat, and polarity inversion is not observed. However, the most of the other part includes surfaces tilted with respect to the GaN crystal, i.e., fine asperities. Thus, polarity inversion did not occur, and the crystal growth plane was determined as a −c-plane. That is, Example 2 (the growth for 60 minutes) satisfies the requirement of the present invention that the crystal growth plane is a −c-plane or a plane approximately parallel with the −c-plane. As described for FIGS. 9 to 11, Example 2 further demonstrates that the diameter of the GaN crystal was further grown by the crystal growth for a long period of time.

Example 3

Figure 14:
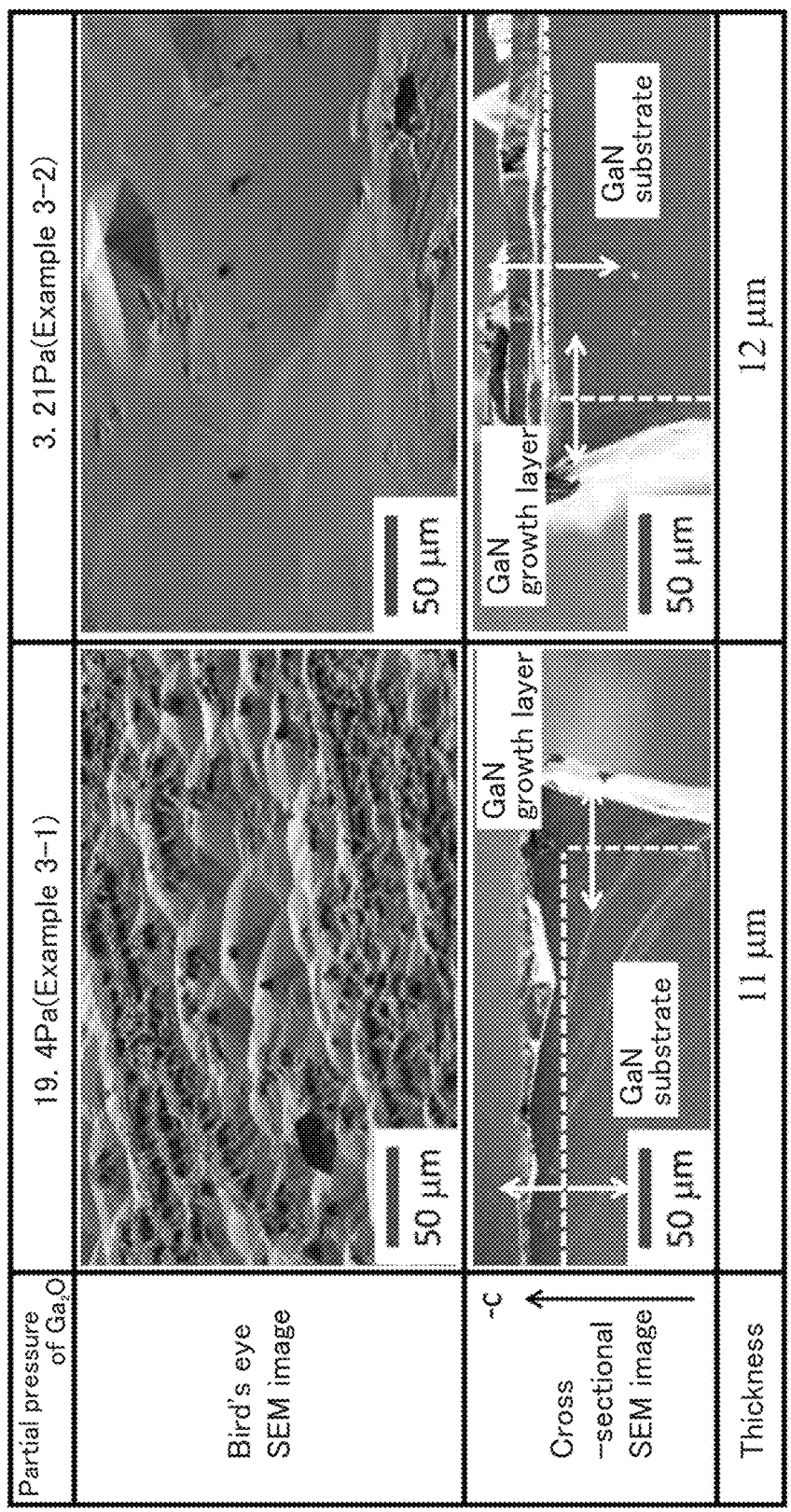
FIG. 14 shows bird's-eye SEM images and cross-sectional SEM images of a GaN crystal produced in Example 3.

GaN was produced at different partial pressures of the Ga$_2$O gas to check a relationship between the degree of supersaturation of a Ga$_2$O gas and the growth of the GaN crystal. That is, a GaN crystal was produced in the same manner as in Example 1 except that the conditions of the vapor phase growth step was the following condition (1) or (2). The condition (1) corresponds to Example 3-1, and the following condition (2) corresponds to Example 3-2. The partial pressure of the Ga$_2$O gas in the vapor phase growth step performed under the following condition (1) was 19.4 Pa, and that in the vapor phase growth step performed under the following condition (2) was 3.21 Pa. A method for calculating (assuming) the partial pressure of the Ga$_2$O gas was the same as in Example 1. The amount of the Ga$_2$O$_3$ powder to be used under the following condition (2) was lower than that under the following condition (1) to reduce a contact area between the Ga$_2$O$_3$ powder and the H$_2$ gas. Thus, the reaction rate was reduced, and the partial pressure of the Ga$_2$O gas was lower than that under the following condition (1).
Condition (1) (Example 3-1)
Temperature of growing potion: 1200° C.
Temperature of raw material portion: 900° C.
Growing time: 60 minutes
NH$_3$ line: NH$_3$ 300 sccm+NH$_3$ 2200 sccm
Ga$_2$O line: H$_2$100 sccm+NH$_3$ 400 sccm
Diameter Φ of raw material tube: 6 mm
Condition (2) (Example 3-2)
Temperature of growing potion: 1200° C.
Temperature of raw material portion: 750° C.
Growing time: 300 minutes
NH$_3$ line: NH$_3$ 300 sccm+NH$_3$ 2200 sccm
Ga$_2$O line: H$_2$ 50 sccm+NH$_3$ 450 sccm
Diameter Φ of raw material tube: 6 mm FIG. 14 shows bird's-eye SEM images and cross-sectional SEM images of the GaN crystals produced under the conditions (1) and (2). The left photographs in FIG. 14 are photographs of the GaN crystal (the partial pressure of Ga$_2$O: 19.4 Pa) produced under the condition (1). The right photographs in FIG. 14 are photographs of the GaN crystal (the partial pressure of Ga$_2$O: 3.21 Pa) produced under the condition (2). The upper photographs in FIG. 14 are the bird's-eye SEM images (photographs of the upper surface of the respective produced GaN crystals before etching), and the lower photographs in FIG. 14 are the cross-sectional SEM images (photographs of the cross sections of outer peripheries at the upper ends of the respective produced GaN crystals). As can be seen from the lower cross-sectional SEM images in FIG. 14, the diameters were increasing toward the top of the respective GaN crystals produced under the conditions (1) and (2). That is, increases in diameter were observed.

Figure 15:
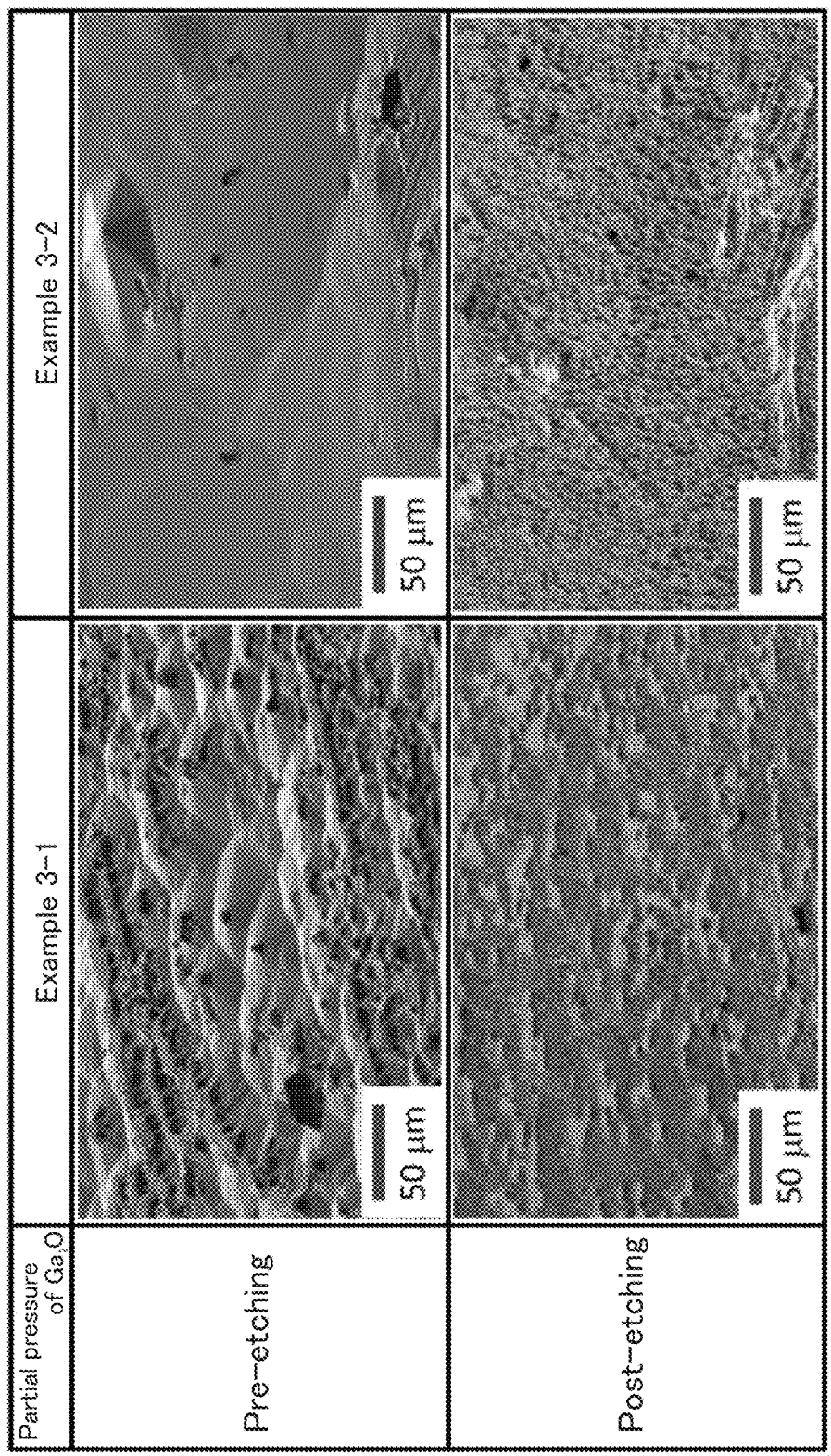
FIG. 15 shows pre-etching bird's-eye SEM images and post-etching bird's-eye SEM images of the GaN crystals produced in Example 3.

The upper surfaces (crystal growth planes) of the respective GaN crystals produced under the conditions (1) and (2) were etched under the same condition as in Example 2 to check polarity inversion. FIG. 15 shows pre-etching bird's-eye SEM images and post-etching bird's-eye SEM images of the GaN crystals produced in Example 3. The left photographs in FIG. 15 are photographs of the GaN crystal (the partial pressure of Ga$_2$O: 19.4 Pa) produced under the condition (1). The right photographs in FIG. 15 are photographs of the GaN crystal (the partial pressure of Ga$_2$O: 3.21 Pa) produced under the condition (2). The upper photographs in FIG. 15 are photographs of the respective GaN crystals before etching, and the lower photographs in FIG. 15 are photographs of the respective GaN crystals after etching. As shown in FIG. 15, the most region of each of the GaN crystals produced under the conditions (1) and (2) includes surfaces tilted with respect to the crystal growth plane, i.e., fine asperities. Thus, it was determined that polarity inversion did not occur, and the crystal growth plane was a −c-plane. That is, both of the GaN crystals produced under the conditions (1) and (2) satisfy the requirement of the present invention that that crystal growth plane is a −c-plane or a plane approximately parallel with the −c-plane.

Example 4

GaN was produced at different temperatures of growing portion (crystal growth temperatures) to check a relationship between the crystal growth temperature and polarity inversion. That is, GaN crystals were produced in the same manner as in Example 1 except that the vapor phase growth step was performed under the following conditions. The following conditions (1) and (2) correspond to reference examples, and the following condition (3) corresponds to the example (Example 4).
Temperature of growing potion: (1) 1100° C., (2) 1150° C., (3) 1200° C.
Temperature of raw material portion: 900° C.
Growing time: 60 minutes
NH$_3$ line: NH$_3$ 300 sccm+NH$_3$ 2200 sccm
Ga$_2$O line: H$_2$ 100 sccm+NH$_3$ 400 sccm
Diameter Φ of raw material tube: 6 mm FIG. 16 shows bird's-eye SEM images and cross-sectional SEM images of the GaN crystals produced at the respective crystal growth temperatures ("growing temperature" in FIG. 16) of (1) 1100° C., (2) 1150° C., and (3) 1200° C. under the above-described condition. The left photographs in FIG. 16 are photographs of the GaN crystal (the partial pressure of Ga$_2$O: 17.3 Pa) produced at the crystal growth temperature of 1100° C. The middle photographs in FIG. 16 are photographs of the GaN crystal (the partial pressure of Ga$_2$O: 18.1 Pa) produced at the crystal growth temperature of 1150° C. The right photographs in FIG. 16 are photographs of the GaN crystal (the partial pressure of Ga$_2$O: 19.4 Pa) produced at the crystal growth temperature of 1200° C. The upper photographs in FIG. 16 are bird's-eye SEM images of the respective GaN crystals (photographs of the upper surfaces of the respective GaN crystals before etching). The lower photographs in FIG. 16 are cross-sectional SEM images (photographs of the cross sections of the outer peripheries at the top of the respective produced GaN crystals). As shown in FIG. 16, increases in diameter were observed at the respective crystal growth temperatures of 1150° C. and 1200° C.

Figure 17:
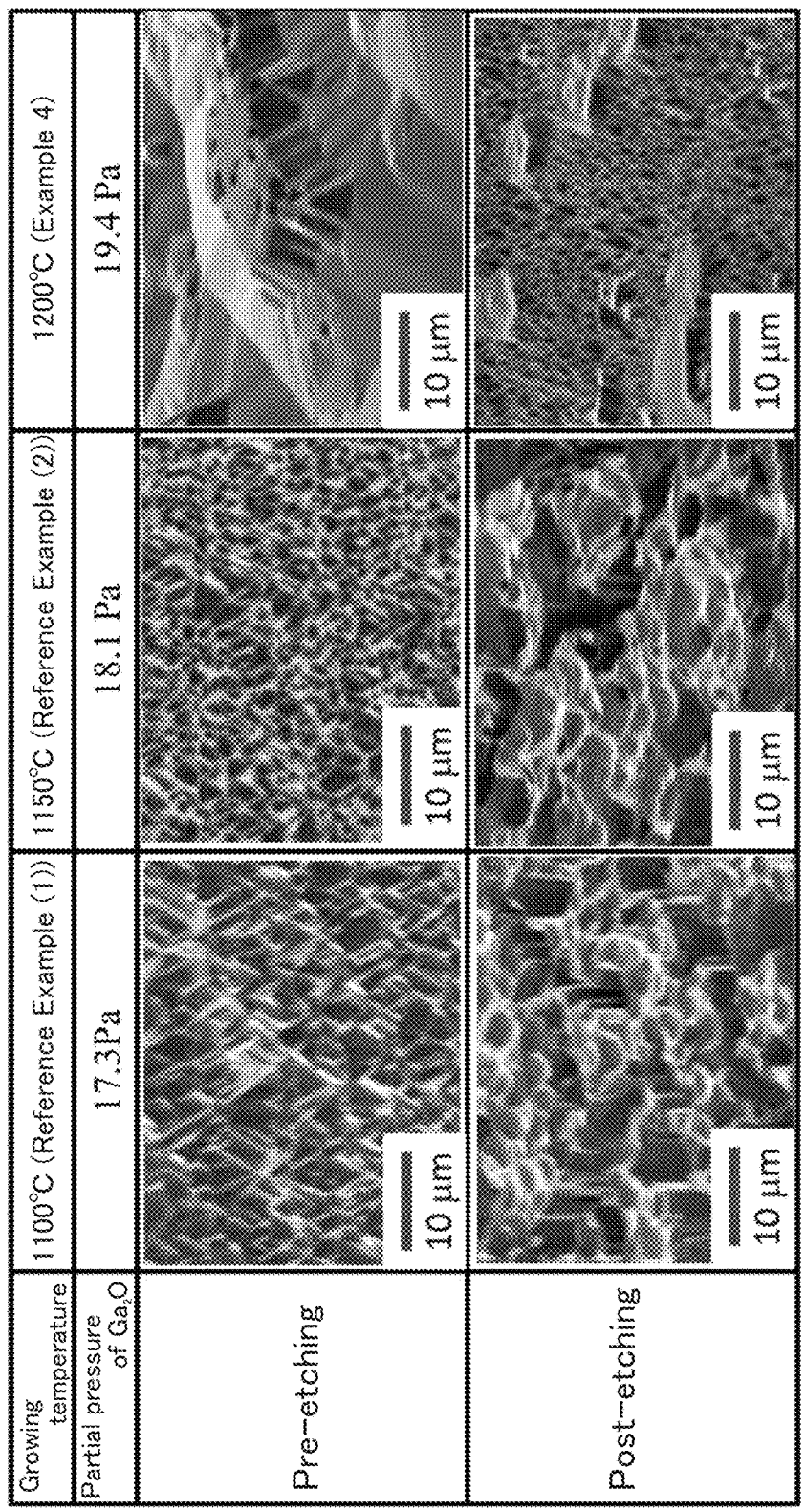
FIG. 17 shows pre-etching bird's-eye SEM images and post-etching bird's-eye SEM images of the GaN crystals produced in Example 4.

FIG. 17 shows pre-etching bird's-eye SEM images and post-etching bird's-eye SEM images of the respective GaN crystals (photographs of the upper surfaces of the respective GaN crystals) produced at the crystal growth temperatures (growing temperatures) of (1) 1100° C., (2) 1150° C., and (3) 1200° C. The upper photographs in FIG. 17 are pre-etching photographs, and the lower photographs on in FIG. 17 are post-etching photographs. The conditions of the etching were the same as in Example 2. As shown in FIG. 17, most region of the GaN crystal produced at the crystal growth temperature of 1200° C. includes surfaces tilted with respect to the crystal growth plane, and prevention of polarity inversion was observed.

Example 5

Figure 18:
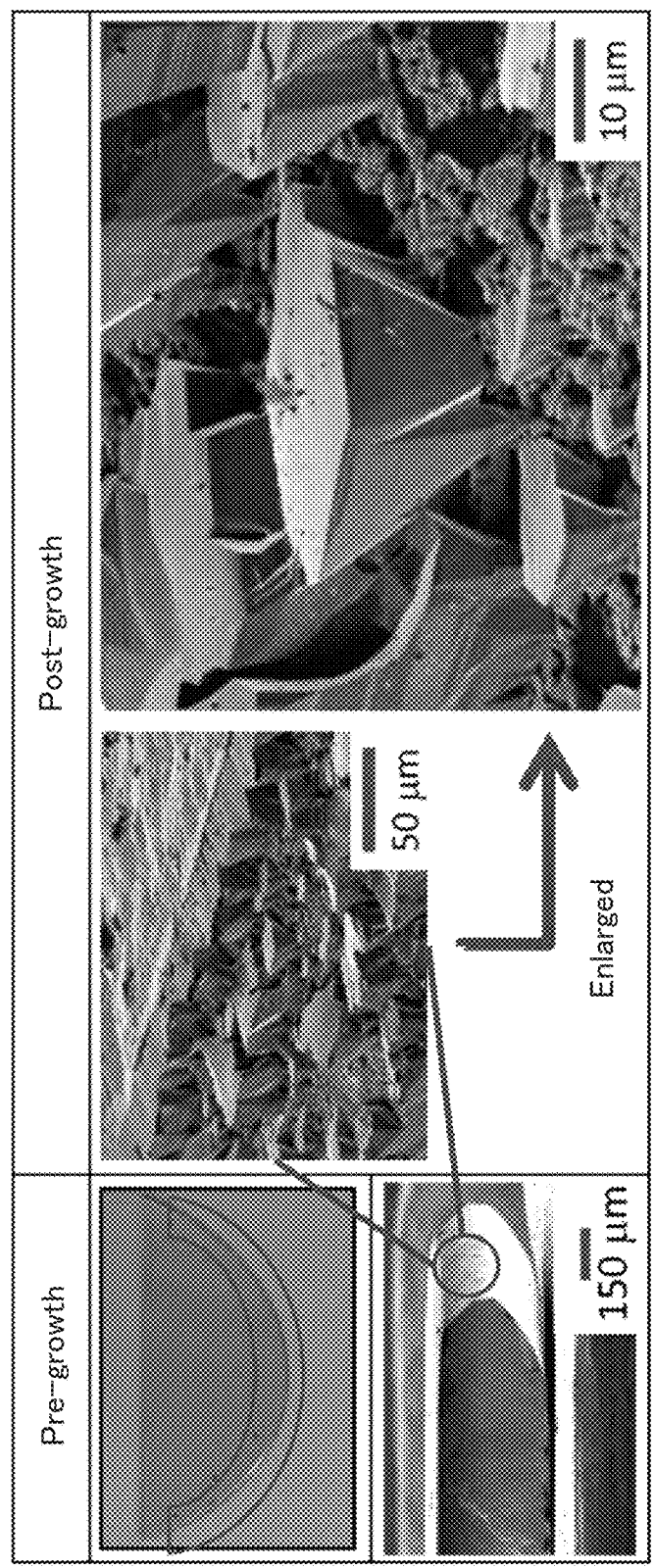
FIG. 18 shows pre-growth SEM images and post-growth SEM images of a GaN crystal produced in Example 5.

A GaN crystal was produced in the same manner as in Example 1 except that the vapor phase growth step was performed under the following conditions. Images of the outer periphery at the top of the GaN crystal were taken to check the state of growing the GaN crystal.
Temperature of growing potion: 1200° C.
Temperature of raw material portion: 900° C.
Growing time: 60 minutes
NH$_3$ line: NH$_3$ 300 sccm+NH$_3$ 2200 sccm
Ga$_2$O line: H$_2$ 100 sccm+NH$_3$ 400 sccm
Diameter Φ of raw material tube: 3 mm FIG. 18 shows pre-growth SEM images of the GaN crystal (i.e., a GaN seed crystal for use in the vapor phase growth step) of the present example and post-growth SEM images of the GaN crystal of the present example. The left images in FIG. 18 are cross-sectional SEM images before the crystal growth, and the right images in FIG. 18 are bird's-eye SEM images (photographs of the outer periphery at the top of the GaN crystal) after the crystal growth. As shown in the bird's-eye SEM images after the crystal growth, fine crystals each having a reverse-pyramid outer periphery at the top were observed. That is, an increase in diameter as crystal growth was observed in the GaN crystal produced in the present example.

Example 6

Figure 19:
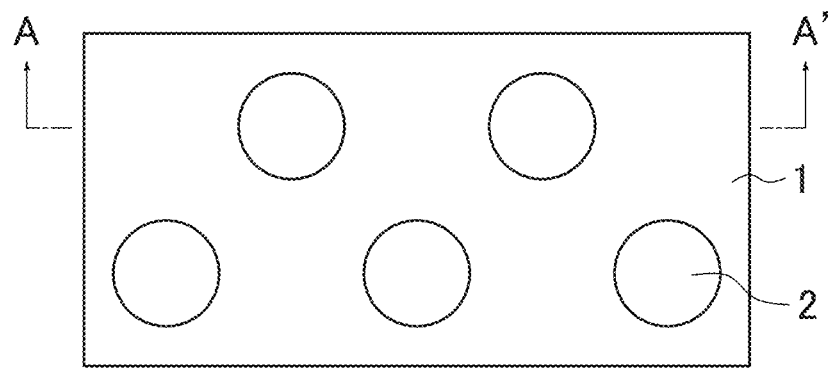
FIG. 19 shows drawings illustrating an overview of a structure including a GaN seed crystal and a mask used in Examples 6 and 7 and Comparative Example 2.
Figure 19:
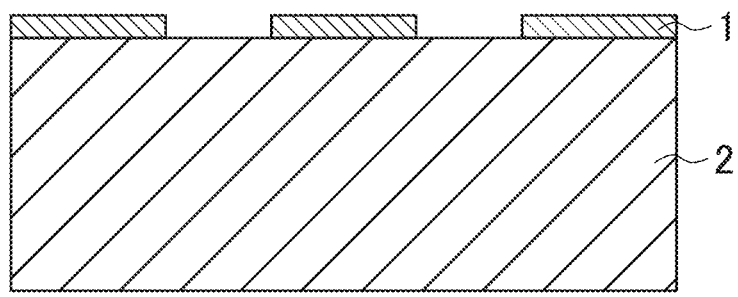

A GaN crystal was produced in the same manner as in Example 1 except that the vapor phase growth step was performed under the following conditions. In the present example, a crystal growth plane (−c-plane) was covered with a mask (formed of silicon nitride) having a plurality of circular through holes, and the vapor phase growth step was then performed. The GaN crystal was thus grown from the through holes on the crystal growth plane (−c-plane), and was not grown from the other portion (portion covered with the mask). The "seed crystal diameter Φ" represents a diameter of each circular through hole, and the "pitch" represents a distance between adjacent through holes.
Temperature of growing potion: 1200° C.
Temperature of raw material portion: 850° C.
Growing time: 15 minutes
$NH_3$ line: $NH_3$ 300 sccm+$NH_3$ 2200 sccm
$Ga_2O$ line: $H_2$ 100 sccm+$NH_3$ 400 sccm
Diameter Φ of raw material tube: 6 mm
Mask pattern: seed crystal diameter Φ: 5 μm/pitch: 100 μm A GaN crystal was produced in the same manner as in the present example (Example 6) except that the +c-plane was used as the crystal growth plane, and the vapor phase growth step was performed under the following conditions (Comparative Example 2). The "seed crystal diameter Φ" and the "pitch" mean the same as in Example 6.
Temperature of growing potion: 1150° C.
Temperature of raw material portion: 820° C.
Growing time: 15 minutes
$NH_3$ line: $NH_3$ 300 sccm+$NH_3$ 2200 sccm
$Ga_2O$ line: $H_2$ 100 sccm+$NH_3$ 400 sccm
Diameter Φ of raw material tube: 3 mm
Mask pattern: seed crystal diameter Φ: 50 μm/pitch: 100 μm FIG. 19 illustrates an overview of the structure including a GaN seed crystal and a mask used in Example 6 and Comparative Example 2. In FIG. 19, (a) is a plane view, and (b) is a cross-sectional view taken along the A-A' direction of (a) in FIG. 19. As shown in FIG. 19, a crystal growth plane (−c-plane or +c-plane) of a GaN seed crystal (free-standing substrate) 2 is covered with a mask 1 having a plurality of circular through holes, and the crystal growth plane of the GaN seed crystal 2 is exposed from the through holes.

Figure 20:
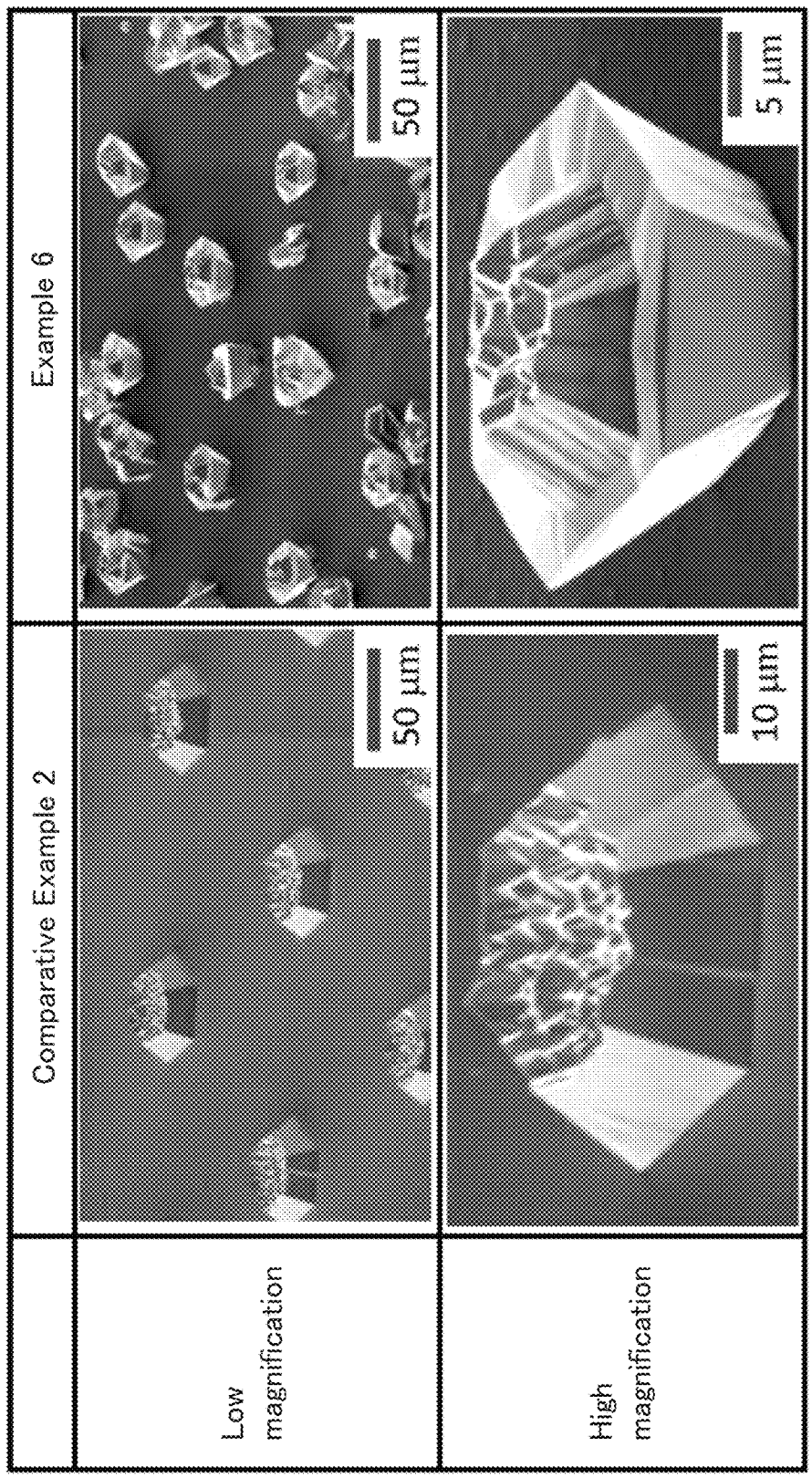
FIG. 20 shows bird's-eye SEM images of GaN crystals produced in Example 6 and Comparative Example 2.

FIG. 20 shows bird's-eye SEM images of GaN crystals produced in Example 6 and Comparative Example 2. As shown in FIG. 20, a tapered GaN crystal having a decreasing (thinning) diameter as growing was obtained in Comparative Example 2. In contrast, an increase in diameter of the GaN crystal of Example 6 as growing was observed.

Example 7

Figure 21:
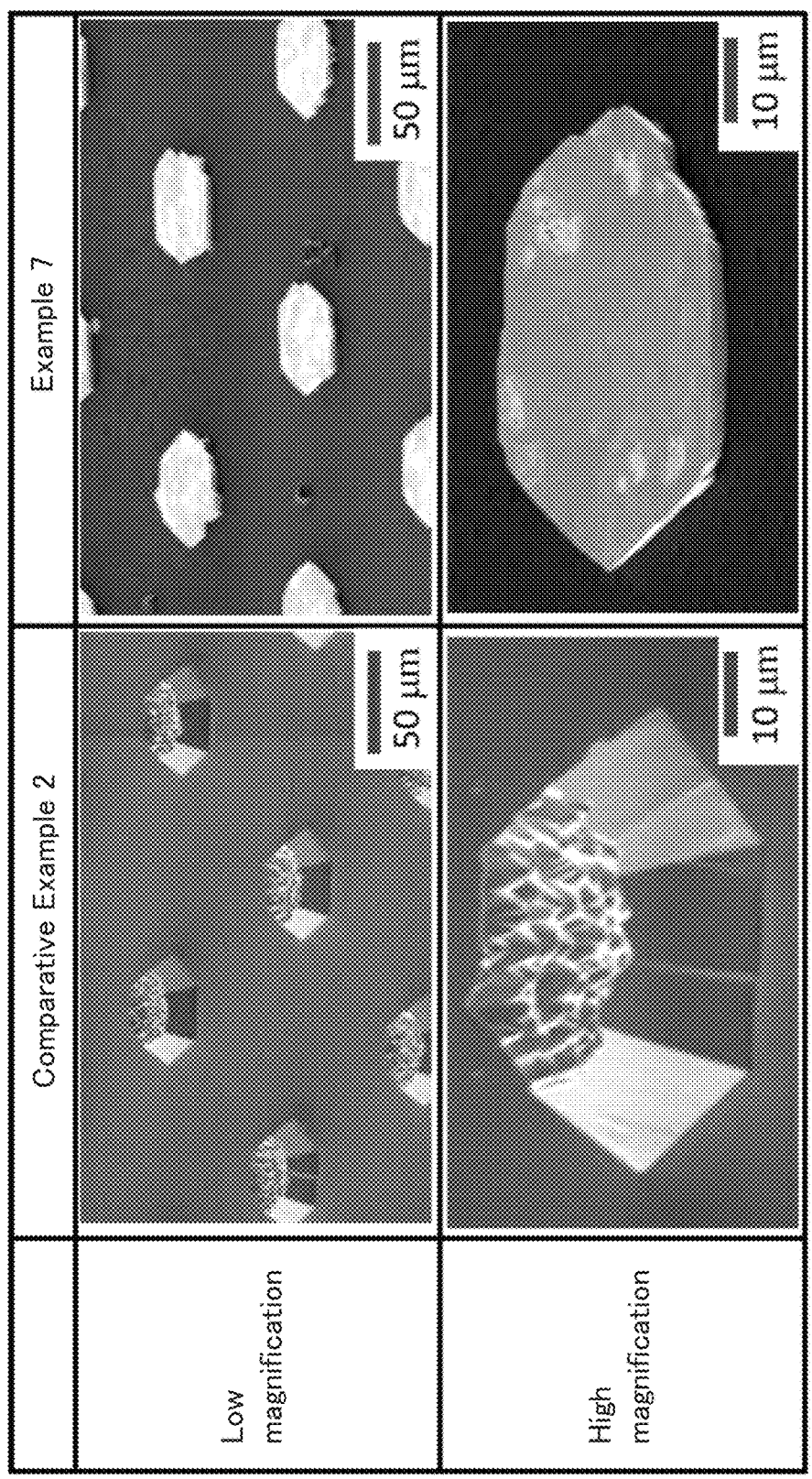
FIG. 21 shows bird's-eye SEM images of GaN crystals produced in Example 7 and Comparative Example 2.

A GaN crystal was produced in the same manner as in Example 6 except that the vapor phase growth step was performed under the following conditions. That is, the present example (Example 7) was the same as Example 6 except that the seed crystal diameter (diameter of each circular through hole) was changed from 5 μm to 50 μm.
Temperature of growing potion: 1200° C.
Temperature of raw material portion: 850° C.
Growing time: 15 minutes
$NH_3$ line: $NH_3$ 300 sccm+$NH_3$ 2200 sccm
$Ga_2O$ line: $H_2$ 100 sccm+$NH_3$ 400 sccm
Diameter Φ of raw material tube: 6 mm
Mask pattern: seed crystal diameter Φ: 50 μm/pitch: 100 μm FIG. 21 shows bird's-eye SEM images of the GaN crystals produced in Example 7 and Comparative Example 2. As shown in FIG. 21, a tapered GaN crystal having a decreasing (thinning) diameter as growing was obtained in Comparative Example 2. In contrast, an increase in diameter of the GaN crystal of Example 7 as growing was observed.

INDUSTRIAL APPLICABILITY

As described above, the production method of the present invention can grow a Group III element nitride crystal using a plane on the −c-plane side as a crystal growth plane. The present invention can further provide a Group III element nitride crystal produced by the production method of the present invention and a Group III element nitride crystal production device for use in the production method of the present invention. The production method of the present invention can prevent polarity inversion of the crystal growth plane and produce a high-quality, large Group III element nitride crystal, for example. Accordingly, for example, by using Group III nitride produced in the present invention as a substitute for Si in a semiconductor device such as a power device generally required to have a large diameter of Si (silicon), a high-frequency device, or the like, the performance can be further improved. Therefore, the present invention exerts a great impact on the semiconductor industry. The present invention, however, is by no means limited thereto and is applicable to any other semiconductor devices and a wide range of other technical fields.

EXPLANATION OF REFERENCE NUMERALS 1 mask
2 GaN seed crystal (free-standing substrate)
10 substrate
11 Group III element nitride seed crystal
12 Group III element nitride crystal
12a aliced Group III element nitride crystal
13, 14 cut surface
100, 300 Group III nitride crystal production device
101 first container
102, 301 second container
103 substrate support
104 Group III metal placement portion
105 oxidizing gas introduction tube
106 Group III metal oxidization product gas delivery tube
107a, 107b nitrogen-containing gas introduction tube
108 exhaust tube
109a, 109b first heating unit
200a, 200b second heating unit
201a, 201b, 401a, 401b oxidizing gas or reducing gas
111a, 111b Group III metal oxidization product gas
202, 400 substrate
203a, 203b, 203c nitrogen-containing gas
203d exhaust gas
204 Group-III nitride crystal (GaN crystal)
302 Group III metal introduction tube
402, 110 Group III metal

The invention claimed is:

1. A method for producing a Group III element nitride crystal, the method comprising:
a vapor phase growth step of growing a Group III element nitride crystal on a crystal growth surface of a Group III element nitride seed crystal by vapor deposition, wherein
the vapor phase growth step is a step of causing a Group III metal, an oxidant, and a nitrogen-containing gas to react with one another to grow the Group III element nitride crystal, or
the vapor phase growth step comprises:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal,
the crystal growth surface is a surface on a −c-plane side,
a crystal growth temperature is 1200° C. or more, and in the vapor phase growth step, the Group III element nitride crystal is grown in an approximately −c direction.

2. The method according to claim 1, wherein
the crystal growth surface of the Group III element nitride seed crystal is parallel with a −c-plane or is approximately parallel with the −c-plane.

3. The method according to claim 1, wherein
the crystal growth surface of the Group III element nitride seed crystal is an uneven surface.

4. The method according to claim 1, wherein
the Group III element nitride crystal growth step is a step of causing a Group III metal, an oxidant, and a nitrogen-containing gas to react with one another to grow the Group III element nitride crystal, and
the Group III metal is at least one selected from the group consisting of gallium, indium, and aluminium.

5. The method according to claim 1, wherein
the vapor phase growth step is a step of causing a Group III metal, an oxidant, and a nitrogen-containing gas to react with one another to grow the Group III element nitride crystal, and
the oxidant is an oxygen-containing compound.

6. The method according to claim 1, wherein
the vapor phase growth step is a step of causing a Group III metal, an oxidant, and a nitrogen-containing gas to react with one another to grow the Group III element nitride crystal, and
the nitrogen-containing gas is at least one selected from the group consisting of $N_2$, $NH_3$, a hydrazine gas, and an alkylamine gas.

7. The method according to claim 1, wherein
the proportion of the volume of the oxidizing gas in the total volume of the oxidizing gas and the nitrogen-containing gas is in the range from 0.001% to 60%.

8. The method according to claim 1, wherein
the vapor phase growth step is a step of causing a Group III metal, an oxidant, and a nitrogen-containing gas to react with one another to grow the Group III element nitride crystal,
in the crystal growth step, the reaction is performed in the presence of a reducing gas in a reaction system,
the oxidant is an oxidizing gas, and
the reducing gas is mixed with the oxidizing gas.

9. The method according to claim 1, wherein
the vapor phase growth step is a step of causing a Group III metal, an oxidant, and a nitrogen-containing gas to react with one another to grow the Group III element nitride crystal, and
in the vapor phase growth step, the Group III element nitride crystal is generated under pressure.

10. The method according to claim 1, wherein
the vapor phase growth step comprises:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal, and
in the reduced product gas generation step, the Group III element oxide is caused to react with the reducing gas under heating.

11. The method according to claim 1, wherein
the vapor phase growth step comprises:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal,
the Group III element oxide is $Ga_2O_3$,
the gas of the reduced product is $Ga_2O$ gas, and
the Group III element nitride crystal is a GaN crystal.

12. The method according to claim 1, wherein
the vapor phase growth step comprises:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal, and
the reducing gas comprises a hydrogen gas.

13. The method according to any claim 1, wherein
the vapor phase growth step comprises:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal, and
the nitrogen-containing gas comprises an ammonia gas.

14. The method according to claim 1, wherein
the vapor phase growth step comprises:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal, and
the crystal generation step is performed under pressure.

15. The method according to claim 1, wherein
the Group III element nitride crystal to be produced is represented by $Al_xGa_yIn_{1-x-y}N$ ($0 \leq x \leq 1$, $0 \leq y \leq 1$, $x+y \leq 1$).

16. The method according to claim 1, wherein
the Group III element nitride crystal to be produced is GaN.

17. The method according to claim 1, wherein
the Group III element nitride crystal to be produced has a major axis of 15 cm or more.

18. The method according to claim 1, wherein
the Group III element nitride crystal to be produced has a dislocation density of $1.0 \times 10^7$ $cm^{-2}$ or less.

19. The method according to claim 1, wherein
in the Group III element nitride crystal to be produced, a half width of each of a symmetric reflection component (002) and an asymmetric reflection component (102) by an X-ray rocking curve analysis (XRC) is 300 seconds or less.

20. The method according to claim 1, wherein the Group III element nitride crystal to be produced has an oxygen concentration of $1 \times 10^{20}$ cm$^{-3}$ or less.

21. The method according to claim 1, wherein the Group III element nitride seed crystal is produced by liquid deposition.

22. A method for producing a semiconductor device comprising a Group III element nitride crystal, wherein the Group III element nitride crystal is a semiconductor, and the Group III element nitride crystal is produced by the method according to claim 1.

23. A Group III element nitride crystal production device for use in the method according to claim 1, comprising:
a vapor phase growth unit configured to grow a Group III element nitride crystal on a Group III element nitride seed crystal by vapor deposition; and
a liquid raw material supply unit configured to continuously supply a liquid form of the Group III metal or the Group III element oxide to the vapor phase growth unit.

24. A Group III element nitride crystal production device for use in the method according to claim 1, wherein the vapor phase growth step in the method is a step of causing a liquid form of a Group III metal, an oxidant, and a nitrogen-containing gas to react with one another to grow the Group III element nitride crystal,
the Group III element nitride crystal production device comprises:
a reaction vessel;
a Group III metal supply unit;
an oxidant supply unit; and
a nitrogen-containing gas supply unit,
the Group III metal supply unit is capable of continuously supplying the Group III metal to the reaction vessel,
the oxidant supply unit is capable of continuously supplying the oxidant to the reaction vessel,
the nitrogen-containing gas supply unit is capable of continuously supplying the nitrogen-containing gas to the reaction vessel, and
the Group III metal, the oxidant, and the nitrogen-containing gas are caused to react with one another in the reaction vessel to produce the Group III element nitride crystal.

25. A Group III element nitride crystal production device for use in the method according to claim 1, wherein the vapor phase growth step in the method comprises:
a reduced product gas generation step of causing a liquid form of a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal,
the Group III element nitride crystal production device comprises:
a reaction vessel;
a Group III element oxide supply unit;
a reducing gas supply unit; and
a nitrogen-containing gas supply unit,
the Group III element oxide supply unit is capable of continuously supplying a Group III metal to the reaction vessel,
the reducing gas supply unit is capable of continuously supplying the reducing gas to the reaction vessel,
the nitrogen-containing gas supply unit is capable of continuously supplying the nitrogen-containing gas to the reaction vessel, and
in the reaction vessel, the Group III element oxide and the reducing gas are caused to react with each other to generate a gas of a reduced product of the Group III element oxide, and
the gas of the reduced product and the nitrogen-containing gas are caused to react with each other to produce the Group III element nitride crystal.

26. The method according to claim 1, wherein the vapor phase growth step is a step of causing a Group III metal, an oxidant, and a nitrogen-containing gas to react with one another to grow the Group III element nitride crystal, and
the oxidant is an oxidizing gas.

27. The method according to claim 26, wherein the oxidizing gas is at least one selected from the group consisting of a $H_2O$ gas, a $O_2$ gas, a $CO_2$ gas, and a CO gas.

28. The method according to claim 1, wherein the vapor phase growth step comprises:
a reduced product gas generation step of causing a Group III element oxide and a reducing gas to react with each other to generate a gas of a reduced product of the Group III element oxide; and
a crystal generation step of causing the gas of the reduced product and a nitrogen-containing gas to react with each other to generate the Group III element nitride crystal, and
the reduced product gas generation step is performed in an atmosphere of a mixed gas of the reducing gas and an inactive gas.

29. The method according to claim 8, wherein the proportion of the reducing gas in the total amount of the mixed gas is 3% or more to less than 100 vol %, and the proportion of the inactive gas in the total amount of the mixed gas is more than 0 to 97 vol % or less.

30. The method according to claim 28, wherein the inactive gas comprises nitrogen gas.

31. The method according to claim 1, wherein the Group III element nitride crystal growth step is a step of causing a Group III metal, an oxidant, and a nitrogen-containing gas to react with one another to grow the Group III element nitride crystal, and
the vapor phase growth step comprises:
a Group III metal oxidation product gas generation step of causing the Group III metal and the oxidant to react with each other to generate a Group III metal oxidization product gas; and
a Group III element nitride crystal generation step of causing the Group III metal oxidization product gas and the nitrogen-containing gas to react with each other to generate the Group III element nitride crystal.

32. The method according to claim 31, wherein in the Group III metal oxidation product gas generation step, the Group III metal is caused to react with the oxidant under heating.

33. The method according to claim 31, wherein the Group III metal oxidization product gas is a Group III metal oxide gas.

34. The method according to claim 33, wherein the Group III metal is gallium, and the Group III metal oxide gas is a $Ga_2O$ gas.

35. The method according to claim 1, further comprising:
a slicing step of slicing the Group III element nitride crystal to cut at least one Group III element nitride crystal substrate out.

36. The method according to claim 35, wherein
the at least one Group III element nitride crystal substrate cut out in the slicing step is used as the Group III element nitride seed crystal in the vapor phase growth step.

37. The method according to claim 36, wherein
the slicing step and the vapor phase growth step that uses the at least one Group III element nitride crystal substrate cut out in the slicing step as the Group III element nitride seed crystal are performed repeatedly.

38. The method according to claim 1, wherein
the vapor phase growth step is a step of causing a Group III metal, an oxidant, and a nitrogen-containing gas to react with one another to grow the Group III element nitride crystal, and
in the crystal growth step, the reaction is performed in the presence of a reducing gas in a reaction system.

39. The method according to claim 38, wherein
the reducing gas is a hydrogen-containing gas.

40. The method according to claim 38, wherein
the reducing gas is mixed with the nitrogen-containing gas.

41. The method according to claim 38, wherein
the reaction in the presence of a reducing gas is performed at 650° C. or more.

42. The method according to claim 38, wherein
the reducing gas is at least one selected from the group consisting of a $H_2$ gas, a carbon monoxide (CO) gas, a hydrocarbon gas, a $H_2S$ gas, $SO_2$ gas, and a $NH_3$ gas.

43. The method according to claim 42, wherein
the hydrocarbon gas is at least one of a methane gas or an ethane gas.

* * * * *